US008748950B2

(12) United States Patent
Levy et al.

(10) Patent No.: US 8,748,950 B2
(45) Date of Patent: Jun. 10, 2014

(54) ON-DEMAND NANOELECTRONICS PLATFORM

(75) Inventors: Jeremy Levy, Pittsburgh, PA (US); Cheng Cen, Pittsburgh, PA (US); Patrick Irvin, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 74 days.

(21) Appl. No.: 13/509,538

(22) PCT Filed: Nov. 17, 2010

(86) PCT No.: PCT/US2010/056951
§ 371 (c)(1),
(2), (4) Date: Nov. 2, 2012

(87) PCT Pub. No.: WO2011/102864
PCT Pub. Date: Aug. 25, 2011

(65) Prior Publication Data
US 2013/0048950 A1  Feb. 28, 2013

Related U.S. Application Data

(60) Provisional application No. 61/262,693, filed on Nov. 19, 2009.

(51) Int. Cl.
*H01L 29/775* (2006.01)

(52) U.S. Cl.
USPC .............................. 257/288; 257/29; 438/151

(58) Field of Classification Search
None
See application file for complete search history.

(56) References Cited

U.S. PATENT DOCUMENTS 6,755,956 B2   6/2004  Lee et al.
7,592,679 B1   9/2009  Kamins et al.
2003/0148562 A1  8/2003  Luyken et al.
2007/0045756 A1  3/2007  Chang et al.

FOREIGN PATENT DOCUMENTS

WO   WO 99-60165 A1   11/1999

OTHER PUBLICATIONS

Cen, Cheng, et al., "Oxide Nanoelectronics on Demand," Science, Feb. 20, 2009, pp. 1026-1030.*
International Search Report PCT/US2010/056951 dated Nov. 10, 2011.
Cheng Cen et al., "Oxide Nanoelectronics on Demand", Science, vol. 323, Feb. 20, 2009, pp. 1026-1030.
Jianfang Wang et al., "Highly Polarized Photoluminescence and Photodetection from Single Indium Phosphide Nanowires", Science, vol. 293 Aug. 24, 2001, pp. 1455-1457.
Yu Huang et al., "Nanowires for Integrated Multicolor Nanophotonics", Small, 2005, 1, No. 1, pp. 142-147.

(Continued)

*Primary Examiner* — Zandra Smith
*Assistant Examiner* — Paul Patton
(74) *Attorney, Agent, or Firm* — Foley & Lardner LLp

(57) ABSTRACT

A reconfigurable device includes a first insulating layer, a second insulating layer, and a nanoscale quasi one- or zero-dimensional electron gas region disposed at an interface between the first and second insulating layers. The device is reconfigurable by applying an external electrical field to the electron gas, thereby changing the conductivity of the electron gas region. A method for forming and erasing nanoscale-conducting structures employs tools, such as the tip of a conducting atomic force microscope (AFM), to form local electric fields. The method allows both isolated and continuous conducting features to be formed with a length well below 5 nm.

13 Claims, 27 Drawing Sheets

(56) References Cited

OTHER PUBLICATIONS

Xiangfeng Duan et al., "Indium phosphide nanowires as building blocks for nanoscale electronic and optoelectronic devices", Nature, vol. 409, Jan. 4, 2001, pp. 66-69.
Oliver Hayden et al., "Nanoscale avalanche photodiodes for highly sensitive and spatially resolved photon detection", Nature Materials, vol. 5, May 2006, pp. 352-353.
Marcus Freitag et al., "Electrically Excited, Localized Infrared Emission from Single Carbon Nanotubes", Nano Letters 2006, vol. 6, No. 7, pp. 1425-1433.
Y.H. Ahn et al., "Efficient visible light detection using individual germanium nanowire field effect transistors", Applied Physics Letters, 91, 162102-1-162102-3, 2007.
Bozhi Tian et al., "Coaxial silicon nanowires as solar cells and nanoelectronic power sources", Nature, vol. 449, Oct. 18, 2007, pp. 885-890.
Liying Jiao et al., "Selective Positioning and Integration of Individual Single-Walled Carbon Nanotubes", Nano Letters, 2009, vol. 9, No. 1, 205-209.
Zhiyong Fan et al., "Large-scale, heterogeneous integration of nanowire arrays for image sensor circuitry", PNAS, vol. 105, No. 32, Aug. 12, 2008, pp. 11066-11070.
C. Cen et al., "Nanoscale control of an interfacial metal-insulator transition at room temperature", Nature Materials, vol. 7, Apr. 2008, pp. 298-302.
Cheng Cen et al,, "Oxide Nanoelectronics on Demand", Science, vol. 323, Feb. 20, 2009, pp. 1026-1030.
A. Ohtomo et al., "A high-mobility electron gas at the LaAlO3/SrTiO3 heterointerface", Nature, vol. 427, Jan. 29, 2004, pp. 423-426.
C.W. Schneider et al., "Microlithography of electron gases formed at interfaces in oxide heterostructures", Applied Physics Letters, 89, 122101-1-122101-3 (2006).
S. Thiel et al., "Tunable Quasi-Two-Dimensional Electron Gases in Oxide Heterostructures", Science, vol. 313, Sep. 29, 2006, pp. 1942-1945.
N. Reyren et al., "Superconducting Interfaces Between Insulating Oxides", Science, vol. 317, Aug. 31, 2007, pp. 1196-1199.
A.D. Caviglia et al., "Electric field control of the LaAlO3/SrTiO3 interface ground state", Nature, vol. 456, Dec. 4, 2008, pp. 624-627.
K. Van Benthem et al., "Bulk electronic structure of SrTiO3: Experiment and theory", Journal of Applied Physics, vol. 90, No. 12, Dec. 15, 2001, pp. 6156-6164.
Tom Feng, "Anomalous photoelectronic processes in SrTiO3", Physical Review B, vol. 25, No. 2, Jan. 15, 1982, pp. 627-642.
Hayato Katsu et al., "Anamalous Photoconductivity in SrTiO3", Jpn. J. Apl. Phys., vol. 39, 2000, pp. 2657-2658.
Eiichi Yagi et al., "Electronic conduction above 4 K of slightly reduced oxygen-deficient rutile TiO2-x", Physical Review B, vol. 54, No. 11, Sep. 15, 1996, pp. 7945-7956.
Akira Yamakata et al., "Kinetics of the photocatalytic water-splitting reaction on TiO2 and Pt/TiO2 studied by time-resolved infrared absorption spectroscopy", Journal of Molecular Catalysis A: Chemical 199 (2003) pp. 85-94.
Taketoshi Minato et al., "The electronic structure of oxygen atom vacancy and hydroxyl impurity defects on titanium dioxide (110) surface", The Journal of Chemical Physics 130, 124502-1-124502-11, (2009).
Dimitar A. Panayotov et al., "n-Type doping of TiO2 with atomic hydrogen-observation of the production of conduction band electrons by infrared spectroscopy", Chemical Physics Letters 436, (2007) 204-208.
Keisuke Shibuya et al., "Metal-insulator transition in SrTiO3 induced by field effect", Journal of Applied Physics, 102, 083713-1-083713-4, (2007).

H.J. Mamin et al., "Isotope-Selective Detection and Imaging of Organic Nanolayers", Nano Letters, vol. 9, No. 8, 2009, pp. 3020-3024.
A. Candini et al., "Hall nano-probes fabricated by focused ion beam", Nanotechnology 17 (2006), pp. 2105-2109.
D.D. Awschalom et al., "Low-noise modular microsusceptometer using nearly quantum limited dc SQUIDs", Appl. Phys. Lett. 53(21), Nov. 21, 1988, pp. 2108-2110.
J.E. Hirsch, "Spin Hall Effect", Physical Review Letters, vol. 83, No. 9, Aug. 30, 1999, pp. 1834-1837.
George M. Whitesides et al., "Molecular Self-Assembly and Nanochemistry: A Chemical Strategy for the Synthesis of Nanostructures", Science, vol. 254, pp. 1312-1319, Nov. 29, 1991.
M.A. Reed et al., "Conductance of a Molecular Junction", Science, vol. 278, Oct. 10, 1997, pp. 252-254.
Ronald P. Andres et al., "Self-Assembly of a Two-Dimensional Superlattice of Molecularly Linked Metal Clusters", Science, vol. 273, Sep. 20, 1996, pp. 1690-1693.
Donald J. Sirbuly et al., "Semiconductor Nanowires for Subwavelength Photonics Integration", J. Phys. Chem. B, 2005, 109, 15190-15213.
R. Agarwal et al., "Semiconductor nanowires: optics and optoelectronics", Appl. Phys. A 85, 209-215, 2006.
D.C. Tsui et al., "Two-Dimensional Magnetotransport in the Extreme Quantum Limit", Physical Review Letters, vol. 48, No. 22, pp. 1559-1562, May 31, 1982.
A. Ohtomo et al., "Artificial charge-modulation in atomic-scale perovskite titanate superlattices", Nature, vol. 419, Sep. 26, 2002, pp. 378-380.
Mark Huijben et al., "Electronically coupled complementary interfaces between perovskite band insulators", Nature Materials, vol. 5, Jul. 2006, pp. 556-560.
D. Leonard et al., "Direct formation of quantum-sized dots from uniform coherent islands of InGaAs on GaAs surfaces", Appl. Phys. Lett. 63(23), Dec. 6, 1993, pp. 3203-3205.
Philip G. Collins et al., "Nanotube Nanodevice", Science, vol. 278, Oct. 3, 1997, pp. 100-103.
Adrian Bachtold et al., "Logic Circuits with Carbon Nanotube Transistors", Science, vol. 294, Nov. 9, 2001, pp. 1317-1320.
David L. Klein et al., "A single-electron transistor made from a cadmium selenide nanocrystal", Nature, vol. 389, Oct. 16, 1997, pp. 699-701.
E.S. Snow et al., "High-mobility carbon-nanotube thin-film transistors on a polymeric substrate", Applied Physics Letters 86, 033105-1-033105-3, (2005).
Stephen Y. Chou et al., "Nanoimprint lithography", J. Vac. Sci. Technol. B 14(6), Nov./Dec. 1996, 4129-4133.
Richard D. Piner et al., "Dip-Pen Nanolithography", Science, vol. 283, Jan. 29, 1999, pp. 661-663.
A.J. Heinrich et al., "Molecule Cascades", Science, vol. 298, Nov. 15, 2002, pp. 1381-1387.
R. Dingle et al., "Electron mobilities in modulation-doped semiconductor heterojunction superlattices", Appl. Phys. Lett. 33(7), Oct. 1, 1978, pp. 665-667.
J.-M. Albina et al., "Structure, stability and electronic properties of SrTiO3/LaAlO3 and SrTiO3/SrRuO3 interfaces", Physical Review B 76, (2007), 165103-1-165103-12.
Alexey Kalabukhov et al., "Effect of oxygen vacancies in the SrTiO3 substrate on the electrical properties of the LaAlO3/SrTiO3 interface", Physical Review B 75, 151404-1-151404-4, 2007.
C.W. Schneider et al., Microlithography of electron gases formed at interfaces in oxide heterostructures, Applied Physics Letters, 89, 122101-1-122101-3, 2006.
M. Basletic et al., "Mapping the spatial distribution of charge carriers in LaAlO3/SrTiO3 heterostructures", Nature Materials, vol. 7, Aug. 2008, pp. 621-625.
Wolter Siemons et al., "Origin of Charge Density in LaAlO3, on SrTiO3 Heterointerfaces: Possibility of Intrinsic Doping", Physical Review Letters, PRL 98 (2007), pp. 196802-1-196802-4.

\* cited by examiner

ON-DEMAND NANOELECTRONICS PLATFORM

STATEMENT REGARDING FEDERALLY SPONSORED RESEARCH

This invention was made with government support under grant #DMR-0704022 awarded by the National Science Foundation, and grant #W911NF0810317 awarded by the Army Research Office. The government has certain rights in the invention.

CROSS-REFERENCE TO RELATED APPLICATIONS

This application claims priority to provisional application Ser. No. 61/262,693, filed Nov. 19, 2009, the disclosures of which are hereby incorporated by reference in their entirety.

BACKGROUND

The success of semiconductors as technologically useful materials is based on features such as: the electrical conductivity of the semiconductor, especially the ability to readily tune the conductivity of the semiconductor materials; the ability to readily create insulating layers that would enable the fabrication of field-effect devices; and the ability to reproducibly create various field-effect devices having nanoscale dimensions. Oxide materials have been identified that combine many of the important electronic properties of semiconductors, such as interfacial superconductivity, strain-driven ferroelectricity, interfacial ferromagnetism, and colossal magnetoresistance.

It should be noted that the information provided here is intended solely to assist the understanding of the reader. None of the information provided or the publications cited is admitted to be prior art. Each of the cited publications is incorporated by reference in its entirety.

SUMMARY

In one aspect, a reconfigurable device is provided including a first insulating layer and a second insulating layer; and a nanoscale quasi one- or zero-dimensional electron gas disposed at an interface between the first and second insulating layers, wherein the device is reconfigurable by applying an external electrical field to the electron gas to change the conductivity of the electron gas.

In one embodiment, the reconfigurable device further comprises at least one other nanoscale quasi one- or zero-dimensional electron gas region, wherein said at least two electron gas regions are configured in a substantially cross shape, and wherein the reconfigurable device is configured as a magnetic field sensor.

In one embodiment, said first and second insulating layers include a polar insulating layer and a non-polar insulating layer, wherein the nanoscale quasi one- or zero-dimensional electron gas has a gap formed therein, and wherein the reconfigurable device is configured as a reconfigurable photodetector. The photodetector can further comprise a gate electrode disposed adjacent the gap. In another embodiment, the photodetector further comprises a plurality of quasi one-dimensional electron gas regions forming a plurality of nanowires each having a gap thereon, wherein the reconfigurable device is configured as a photodetector array.

In one embodiment, said interface extends a few unit cells into one of the first or second insulating layers. For example, said interface extends about 3 unit cells into one of the first or second insulating layers.

In one embodiment, the electron gas region comprises at least one memory cell, and wherein the reconfigurable device is configured as a memory device.

In one embodiment, the reconfigurable device further comprises a plurality of nanoscale wires formed with electron gas regions, and wherein the reconfigurable device is configured as a reconfigurable transistor.

In one aspect, a reconfigurable transistor comprises a first nanoscale wire; a second nanoscale wire disposed substantially along the direction of the first nanoscale wire, wherein a gap between the first and second nanowares have a first length; and a third nanoscale wire disposed along a direction substantially different from the direction of the first or second nanaoscale wire, wherein an end of the third nanoscale wire has a second distance to the gap larger than the first distance.

In one embodiment, the first, second, and third nanoscale wire comprise quasi-one dimensional or two dimensional electron gas disposed at an interface between a polar material and a non-polar material. For example, the polar insulating layer comprises $LaAlO_3$, and wherein the non-polar insulating layer comprises $SrTiO_3$.

In one embodiment, the first nanoscale wire is coupled to a source electrode, the second nanoscale wire is coupled to a drain electrode, and the third electrode is coupled to a gate electrode.

In one embodiment, the direction of the third nanoscale wire is substantially orthogonal to the direction of the first or second nanoscale wire.

In one embodiment, each of the first, second, and third nanoscale wire is removable or reconfigurable in its respective length, width, and position by an external electric field applied to the reconfigurable transistor.

In another aspect, a magnetic field sensor is provided including at least two nanoscale quasi one- or zero-dimensional electron gas regions disposed at interfaces between insulating layers, wherein the at least two electron gas regions are configured in a substantially cross shape.

In another aspect, a photodetector is provided including a nanoscale wire formed at an interface between $SrTiO_3$ and $LaAlO_3$.

In another aspect, a reconfigurable transistor is provided including a first nanoscale wire, a second nanoscale wire disposed substantially along the direction of the first nanoscale wire, wherein a gap between the first and second nanowares have a first length, and a third nanoscale wire disposed along a direction substantially different from the direction of the first or second nanoscale wire, wherein an end of the third nanoscale wire has a second distance to the gap larger than the first distance.

The first, second, and third nanoscale wire can include quasi-one dimensional or two dimensional electron gas disposed at an interface between a polar material and a non-polar material. The polar insulating layer can comprise $LaAlO_3$, and the non-polar insulating layer can comprise $SrTiO_3$. The first nanoscale wire can be coupled to a source electrode, the second nanoscale wire can be coupled to a drain electrode, and the third electrode can be coupled to a gate electrode.

In one embodiment, the direction of the third nanoscale wire is substantially orthogonal to the direction of the first or second nanoscale wire.

Each of the first, second, and third nanoscale wires is removable or reconfigurable in its respective length, width, and position by an external electric field applied to the reconfigurable transistor.

In another aspect, a method is provided including forming a nanoscale quasi one- or zero-dimensional electron gas region disposed at an interface between a first and a second insulating layers, and applying an external electrical field to the electron gas region to change a conductivity of the electron gas region.

In one embodiment, the first and a second insulating layers include a polar insulating layer and a non-polar insulating layer.

In one embodiment, the method further includes forming a substantially T-shaped electron gas region at an interface between a polar insulating layer and a non-polar insulating layer, erasing a center portion of the T-shaped electron gas region with an external electric field thereby forming a source terminal, a drain terminal, and a gate terminal, forming a nanoscale wire between the source and drain contacts wherein the nanoscale wire is substantially narrower than the T-shaped electron gas region, and forming a gap between the source and drain terminals, thereby forming a reconfigurable transistor.

In one embodiment, said forming a substantially T-shaped electron gas region comprises applying an external electric field to the interface at a first voltage, wherein said forming a nanoscale wire comprises applying an external electric field to the interface at a second voltage, wherein said forming a gap comprises applying an external electric field to the interface at a second voltage, wherein the first and second voltages are positive, wherein the third voltage is negative, and wherein the second and third voltages have values substantially smaller than that of the first voltage.

In one embodiment, said applying an external electric field comprises applying an electric field from an atomic force microscope (AFM).

DESCRIPTION OF THE DRAWINGS

FIG. 5A is a sketch illustrating how a potential barrier is created by scanning a negatively biased AFM probe. (Inset (A)) Either increasing the magnitude of negative tip bias ($V_{tip}$) or scanning across the wire for more times ($N_{cut}$) with the same tip bias will increase the height of potential barrier.

FIG. 5B is an illustration of the structure used for a four-wire measurement.

FIG. 5C is a sketch of a two-wire ac measurement scheme.

FIG. 5D plots the I-V characteristics of a 2 μm long and 12 nm wide uncut wire section and the same section with different potential barrier in the middle created with different negative tip bias ($V_{tip}$=−0.5 V, −1 V, −2 V, ..., −10 V). The upper inset shows the conductance of the uncut wire (slope of the I-V curve) to be 6.8 μS. The lower inset shows the turn-on voltage of the nanowire section with a potential barrier as a function of the $V_{tip}$ that is used to create the barrier.

FIG. 5E is the conductance of a 12 nm wide wire with a potential barrier at the middle created with $V_{tip}$=−0.05 V measured as number of cuts $N_{cut}$. As $N_{cut}$ increases the barrier height increases. The dashed line shows an exponentially decaying conductance G as a function of barrier height (G∝exp [−A'N$_{cut}$]), which is typical for thermal activated hopping. The solid line shows a reference curve following tunneling behavior, G∝exp [−A$\sqrt{N_{cut}-N_0}$], with best-fit parameters A=0.99, N$_0$=17.2.

FIG. 6A is a schematic diagram of SketchFET structure.

FIG. 6B is the I-V characteristic between source and drain for different gate biases V$_{GD}$=−4 V, −2 V, 0 V, 2 V, 4 V.

FIG. 6C is a contour plot of I$_D$(V$_{SD}$,V$_{GD}$). Contours are spaced 50 nA apart.

FIGS. 8A-8 C illustrate, for the SketchFET structure, source-drain current measured as a function of the tip position across the wire while cutting the wire with the tip biased negatively. A sharp drop in conductance occurs when the tip passes the wire. The decrease in conductance can be fit to a profile $I(x)=I_0-I_1 \tanh(x/h)$. Also plotted is the deconvolved differential current $(dI/dx)^{*-1}$. FIG. 8A shows cutting a wider portion of the channel (written with 10 V) with −10 V tip bias, deconvolved differential current shows a full width at half maximum of δx=12 nm.

FIG. 8B shows cutting narrower portion of the channel (written with 3 V) with −3 V tip bias, deconvolved differential current shows a full width at half maximum of δx=2.1 nm.

FIG. 8C shows repeated cutting and restoring of a 12 nm nanowire using $V_{tip}=+/-10$ V.

FIGS. 17A-17 C illustrate the operation of SketchFET at GHz frequencies. Specifically, FIG. 17 A illustrates the electrical schematic of mixing heterodyne experiment. Microwaves at frequency f plus a DC bias $V_{SD}$ are applied to the source electrode; microwaves at frequency f+df plus a DC bias $V_{GD}$ are applied to the gate electrode. The drain current $i_D$ is measured with a lock-in amplifier at frequency df.

FIG. 17B shows $i_D$ plotted as a function of RF frequency f for $V_{SD}$; $V_{GD}=0$ V. Symbols are data points and the solid line is a fit. The data are well-described by Equation 1 as discussed below. The locations of the parameters $i_{noise}$ (noise floor), $i_{df}$ (low-frequency response current), $f_T$ (transition frequency), and $f_C$ (cutoff frequency) are shown with dashed lines.

FIG. 17C shows that $V_{SD}$ and $V_{GD}$ tune the frequency response of the SketchFET. All data taken at RF power $P_{RF}=0$ dBm.

DETAILED DESCRIPTION

Figure 1:
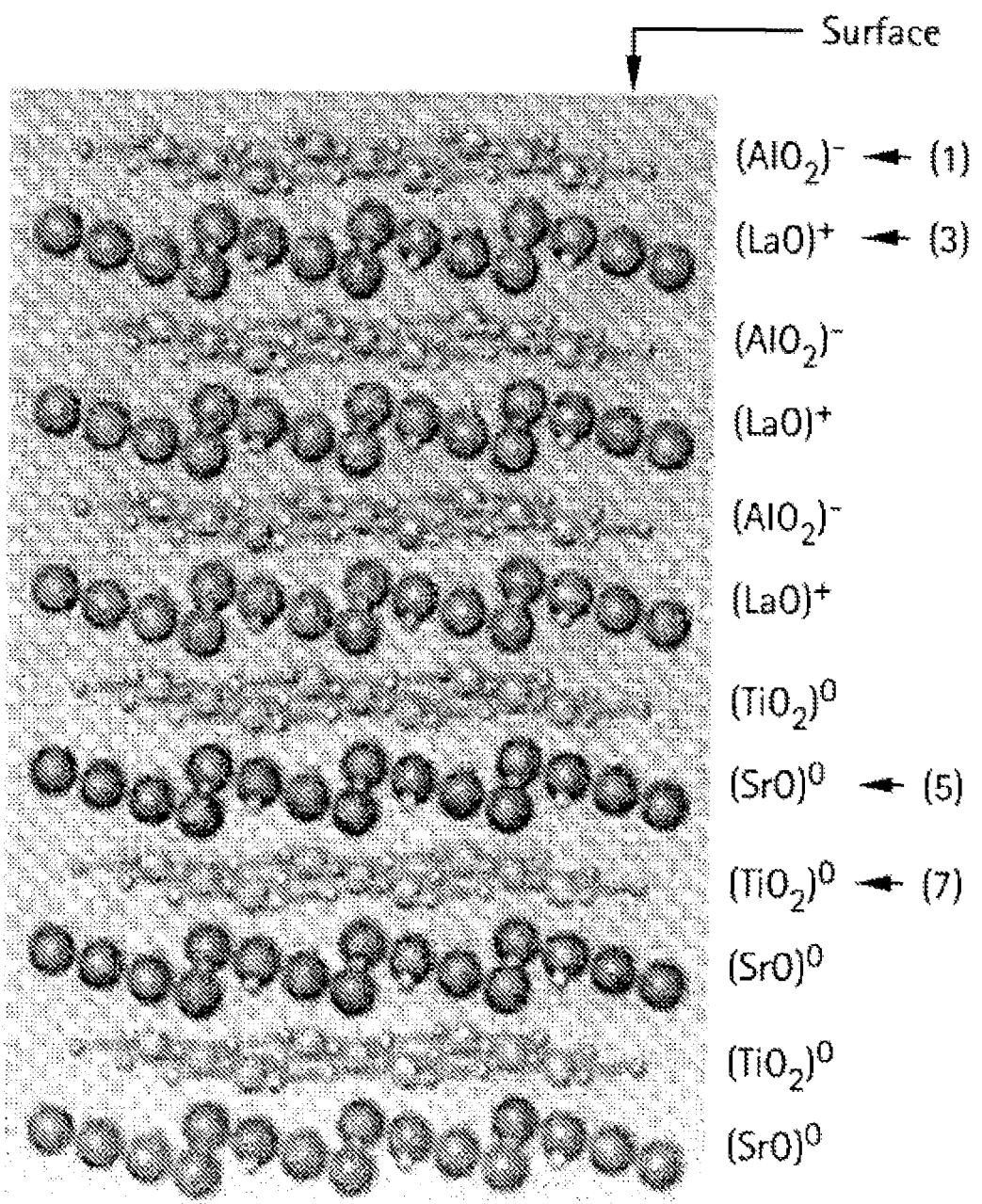
FIG. 1 is a schematic diagram of the LaAlO$_3$/SrTiO$_3$ heterostructure. The oxide heterostructure comprises alternating layers of (AlO$_2$)$^-$ (1) and (LaO)$^+$ (3), so as to form a polar insulating layer of lanthanum aluminate that is grown epitaxially onto a non-polar strontium titanate insulating layer formed of alternating SrO (5) and TiO$_2$ (7) layers.

The embodiments described here relate to devices characterized by having nanoscale dimensions and to methodology for their creation. In particular, some embodiments relate to nanoscale devices comprising quasi one- or zero-dimensional electron gas at the interface between insulating oxide layers. In this context, the phrase "electron gas" refers to small isolated "puddles" of conducting electrons (see, e.g., Finkelstein, et al., Science, 2000, 289, 90), which form locally at the interface between the insulating oxide layers, pursuant to the embodiments disclosed herein, upon the application of an external electric field by means of an atomic force microscope.

It is to be understood that the particular materials, device structures, methods for making the device, and uses thereof are being presented by way of examples. The materials and methods for making the devices may be different from the examples presented herein. It is also understood that the terminology used herein is for the sole purpose of describing particular embodiments and is not intended to be limiting.

In the context of applying local electric fields, the phrase "local field" refers to an electric field that is applied to a specific nanoscale portion or region of the oxide heterostructure having one dimension smaller than 1000 nm. Preferably, the electric field is applied to a region that is less than 100 nm wide, and preferably a region in the range from about 1 nm to about 20 nm wide.

The phrase "local metallic region" refers to an electrically conductive region that has a nanoscale dimension, such as a width of 1000 nm or less.

The phrase "oxide heterostructure" refers to a material system that comprises a polar insulating layer (e.g., LaAlO$_3$), grown epitaxially on to a non-polar insulating layer (e.g., SrTiO$_3$). Preferably, the polar insulating layer has a thickness that allows metal-insulator transition to occur in the presence of an external electric field. For a SrTiO$_3$/LaAlO$_3$ material system the thickness of the polar LaAlO$_3$ layer is preferably three unit cells.

The phrase "nanoscale electrode" refers to electrodes within a nanoscale portion or region of the oxide heterostructure, wherein the electrodes themselves have nanoscale dimensions.

The phrase "interconnect" refers to a nanowire made using a conducting atomic force microscope to electrically connect two electronic or solid state devices, such as two transistors through an insulating layer.

The phrase "conductive region of passive device" refers to a nanowire which is an electrode of a capacitor, is the conductive portion of a resistor, or winds around a magnetic region in an inductor.

The phrase "perovskite structure" refers to a structure comprising the general formula ABX$_3$. Compounds having a perovskite structure comprise 12-coordinated A$^{2+}$ atoms on the corner of a cube, octahedral X$^-$ anion in the center of the face edges, and a tetrahedral B$^{4+}$ ions in the middle of the cube. A perovskite structure can also be tetragonal, orthorhombic, or rhombohedral, depending on temperature.

The ability to induce a metal-insulator transition at the interface between two insulating oxide layers through the application of an external electric field has been reported. See Thiel, Science, 2006, 313, 1942. A material system that allows electric field-induced, metal-insulator quantum phase transitions often comprises a polar oxide layer, e.g., LaAlO$_3$, LaTiO$_3$, LaVO$_3$ or KTaO$_3$, overlaying a non-polar oxide layer, such as SrTiO$_3$. Electronically, the metal-insulator transition in such a material system is due to the formation of a conductive electron gas at the interface between the insulating layers.

Figure 2A:
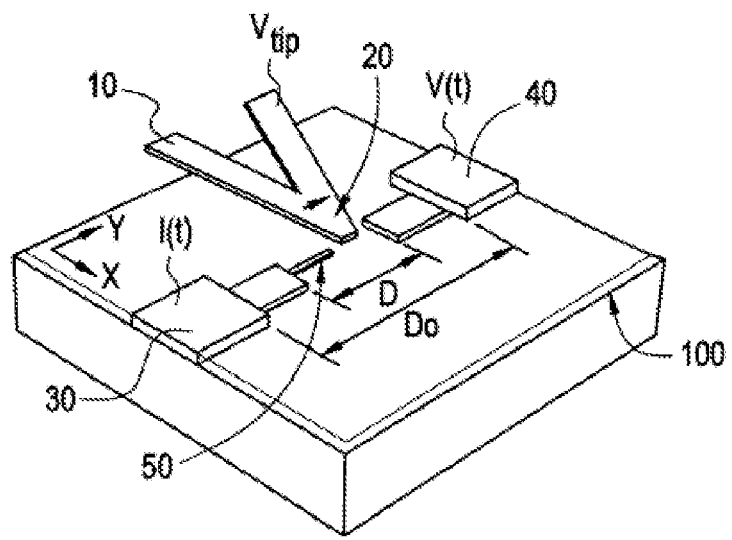
FIG. 2A is a schematic diagram for creating nanostructures, such as a wire nanostructure, using a conducting AFM probe (10). A voltage-biased AFM tip (20) is scanned from one electrode (30) towards a second electrode (40) in contact mode. The tip (20) generates an electric field that causes a metallic quasi-1DEG (q-1DEG) to form locally at the interface between the LaAlO$_3$ and SrTiO$_3$ layers.
Figure 3A:
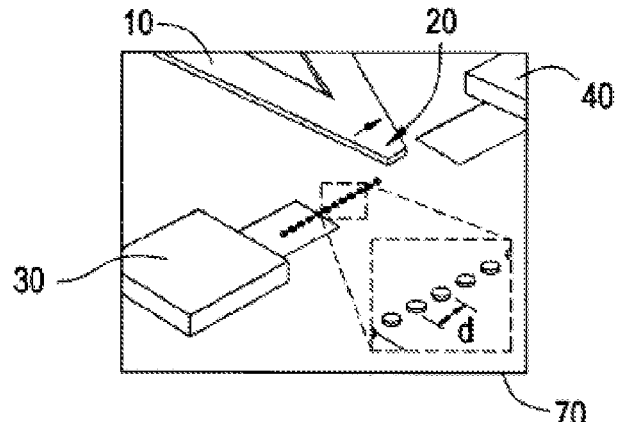
FIG. 3A is a schematic showing a linear array of conductive quantum dots (70) written with voltage pulses from the tip (20) of a conducting AFM.

As noted above, the embodiments described below relate to technologically useful nanoscale devices, and to methods for forming and removing (erasing) nanoscale-conducting structures, using tools that create local electric fields. The tools can include, for example, a tip of a conducting atomic force microscope (AFM). The methods allow both isolated and continuous conducting features to be formed with length in a range well below 5 nm. One illustration of an isolated conducting feature is a conductive quantum dot as shown in FIG. 3A. A continuous conducting feature is exemplified by a nanowire connecting the electrodes as shown in FIG. 2A.

A material system is provided that comprises growing a polar insulating layer of LaAlO$_3$ onto a TiO$_2$-terminated insulating SrTiO$_3$ layer. According to one embodiment, the thickness of the LaAlO$_3$ layer is configured such that it allows metal-insulator transitions upon the application of an external electric field. Preferably, the thickness is three unit cells. Samples of the oxide heterostructure prepared as described below were used for the metal-insulator transition studies. It should be noted that the thickness of the polar layer is selected such that it also allows eliminating conduction due to polar discontinuity.

In a further aspect, an AFM tip is used to contact the top LaAlO$_3$ surface. The AFM tip is biased at a voltage V$_{tip}$ with respect to the interface, and results in producing an interfacial metallic (V$_{tip}$>0) or insulating (V$_{tip}$<0) state directly below the area of contact. FIG. 1 shows a schematic view of the LaAlO$_3$/SrTiO$_3$ oxide heterostructure. As seen in FIG. 1, the heterostructure comprises alternate layers of (AlO2)$^-$ (1) and (LaO)$^+$ (3), so as to form a polar lanthanum aluminate layer that is grown epitaxially onto a non-polar strontium titanate insulating layer formed of SrO (5) and TiO$_2$ (7) layers.

Figure 2B:
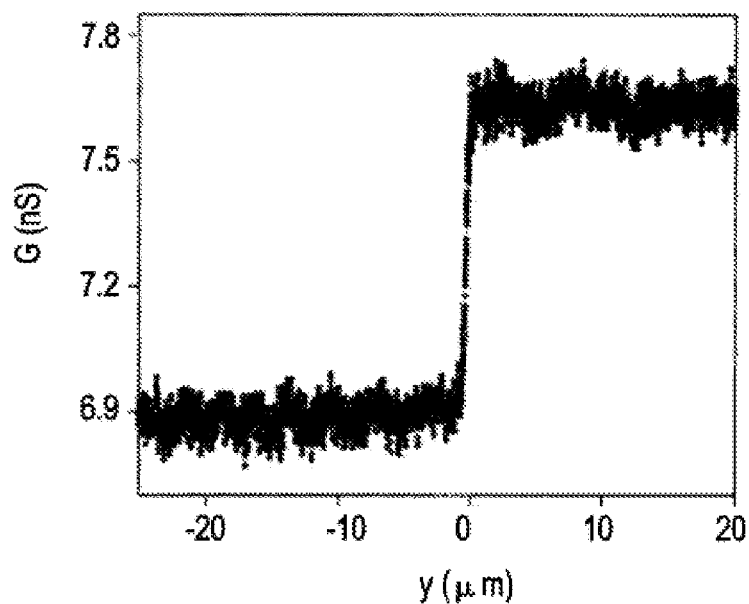
FIG. 2B is a graph of conductance as a function of the tip (20) position while writing a conducting wire (50) with a 3V bias applied to the tip. A steep increase in conductance occurs when the tip reaches the second electrode (40).

A method is provided for creating nanoscale electrically conductive region through the application of a local electric field at the surface of the LaAlO$_3$ layer, which induces insulator-metal transition below the point of contact. Accordingly, a device is provided that is formed by contacting the LaAlO$_3$ layer with the source of an external electric field such as the tip of a conducting AFM, an electron beam, or nanoscale electrode. FIG. 2A shows a schematic of the experimental set-up for writing a conducting wire (50) according to one embodiment. As shown in FIG. 2A the material system comprises an oxide heterostructure having a set of electrodes that are placed in contact with the interface, and separated from each other by a finite distance. A voltage-biased tip (20) of an AFM is then scanned from one electrode (30) towards the second electrode (40) in contact mode. The electric field generated by the tip causes a metallic quasi-1 or 0-dimensional electron gas (q-1DEG or q-0DEG) to form locally at the interface (100) between the LaAlO$_3$ and SrTiO$_3$ layers. In this embodiment, the AFM tip was biased at a voltage of 3V, and a lock-in amplifier was used to measure the conductance between the two electrodes. As shown in FIG. 2B, the measured conductance changes as a function of the tip position. Moving the AFM tip in contact mode towards the second electrode results in a steep increase in measured conductance with a maximum conductance occurring when the AFM tip reaches the second electrode.

A method is also provided for creating and erasing nanowires and quantum dots using a conducting AFM tip (20) to create localized electrically conductive regions at the interface of the insulating layers. The nanowires can have a width less than 20 nm, more preferably a width in the range of about 3.3 nm to about 10 nm and even more preferably a width less than 6 nm, 5 nm, and 4 nm. In one embodiment, the nanowire has a width of about 2.1 nm. In still another embodiment, the quasi-one-dimensional electrically conductive region has a length in the range of about 100 nm to about 100 µm, more preferably a length in the range of about 100 nm to at least about 10 µm, and even more preferably a length less than 700 nm, 600 nm, 500 nm, 400 nm, 300 nm, and 200 nm. In one embodiment, the nanowire has a length of at least about 100 nm.

Conductive quantum dots can be formed with a diameter or width less than about 20 nm. Preferably the conductive quantum dots have a width or diameter in the range from about 1 nm to about 10 nm.

The conductive region formed at the interface of the insulating layers can retain its conductivity for a sufficiently long time interval after the withdrawal of the first external local electric field to provide useful function. Conductivity can be retained, for example, for at least about 12 h and more preferably from at least about 12 h to at least about 24 h. In some embodiments the conductive region retains its conductivity for a time interval greater than 24 h.

According to some embodiments, the nanowires or quantum dots are buried at the interface of the two insulating materials. Thus, while it is believed that the nanowire or quantum dot is formed from the so-called one- or zero-dimensionally confined electron gas at the interface, it is possible that a physical arrangement or rearrangement of atoms at the interface may also contribute to or form the nanowire or quantum dot.

Figure 2C:
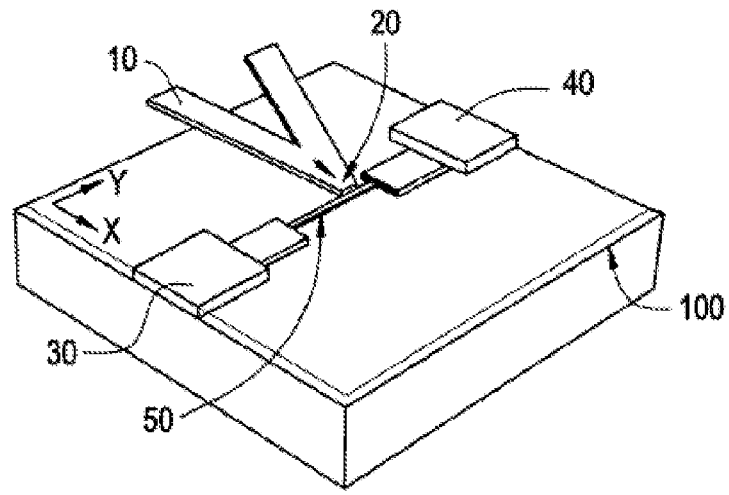
FIG. 2C is a schematic diagram of the experimental set up for cutting a conducting wire. A negatively biased AFM tip (20) moves in contact mode across the conducting wire (50). The tip erases the metallic q-1DEG locally when it crosses the conducting wire. The conductance between the two electrodes (30, 40) is monitored as the tip scans over the wire (50).
Figure 2D:
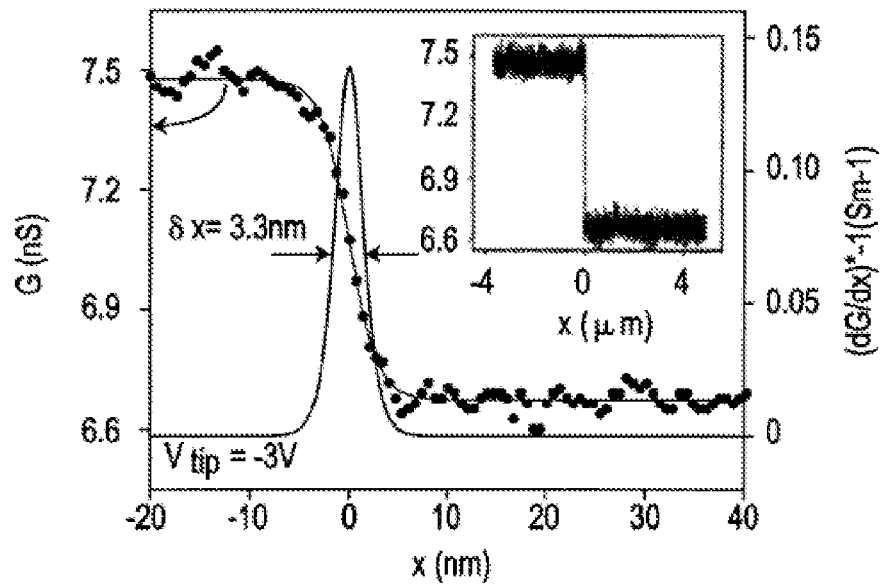
FIG. 2D is a graph of the conductance between the two electrodes (30, 40) as a function of the tip (20) position across the wire (50), while cutting the wire with the tip biased at −3V. A sharp drop in conductance is observed when the tip passes the wire (50). Inset shows the conductance measured over the entire 8 μm scan length. The decrease in conductance can be fitted to a profile G(x)=Go−G$_1$ tan h(x/h). The deconvoluted differential conductance (dG/dx)$^{-1}$, shows a full width at half maximum δx=3.3 nm (see, also, FIG. 8B below, where δx=2.1 nm is shown for measured differential current).

A method is also provided for measuring the transverse dimension of a conducting nanowire. As shown in FIG. 2C, the nanowire can be "cut" by applying a reverse voltage to the tip of the AFM (V$_{tip}$=−3 V), although other tools such as electron beam lithography or nanoscale electrodes may also be used for this purpose. Thus, as the AFM tip (20) crosses the wire, the measured conductance decreases abruptly as seen from the graph in FIG. 2D. Assuming that this erasure process has a resolution comparable to the writing process, the diameter of the nanowire can be determined from the plot of the deconvolved differential profile (dG/dx)$^{*-1}$ as a function of tip position. Importantly, subsequent writing over the affected area with positive voltages (for example, V$_{tip}$=+3 V) restores the conductivity of the nanowire. Furthermore, there are several technological advantages for the small size of structures that can be created (nanowires and quantum dots) using the above method. For example, devices capable of performing all essential electronic functions on a single chip can be formed. Both active elements, such as FETs, and passive elements, such as resistors and capacitors, are easily fabricated, while inductors can also be created using conductive loops around magnetic particles. In fact, the method allows for non-volatile on/off states, enabling reconfigurable logic and memory devices based on reconfigurable transistors. Such a memory device can comprise a plurality of memory cells formed with the 0-D or 1-D electron gas regions.

Additional applications for the nanoscale devices include single-electron transistors (SETs) that operate at room temperature. SET's require ultra-small capacitance quantum dots, namely, dots smaller than 10 nm to operate at room temperature. Quantum dots having these dimensions are already within the reach using the method embodiments.

Another application of the embodiments is hard drive data storage for computers. The embodiments provide a method of creating nanoscale devices that permit high density data storage. For example, nanowires with a width in the range from about 3.3 nm to about 10 nm can be formed. To demonstrate the high degree of spatial resolution of such structures, an array of "dots" was created by pulsing the oxide heterostructure using the tip of a conducting AFM. This allowed small isolated "puddles" of conducting electrons that form locally at the interface between the two insulating layers. The resultant array of q-0DEG quantum dots was visualized using Kelvin probe microscopy for analyzing the spatial resolution of the array of dots.

A linear array of "quantum dots" (70) is written as shown in FIG. 3A. Dots were created by applying voltage pulses V$_{tip}$(t) having an amplitude V$_{pulse}$ and pulse duration t$_{pulse}$ to the tip (20) of the AFM while keeping the tip position fixed. The size of the dots created depends on the amplitude as well as the duration of the applied pulse. In one exemplary embodiment, V$_{pulse}$ was fixed at 10 V while the duration of the pulse was varied to change the size of the dots. To determine the effective dot size a linear array of dots at various separation distances "d" between two adjacent dots was created. The two ends of the linear array are then contacted to two conducting electrodes and the conductance between the two electrodes is monitored using a lock-in amplifier. If the spacing between the dots is greater than the dot diameter, the dots do not overlap and no increase in conductance is observed. However, once the spacing between dots becomes equal to or less than the dot diameter, the linear array will form a conducting wire, and an abrupt increase in conductance between the two electrodes ($\Delta G$) is observed.

Figure 3B:
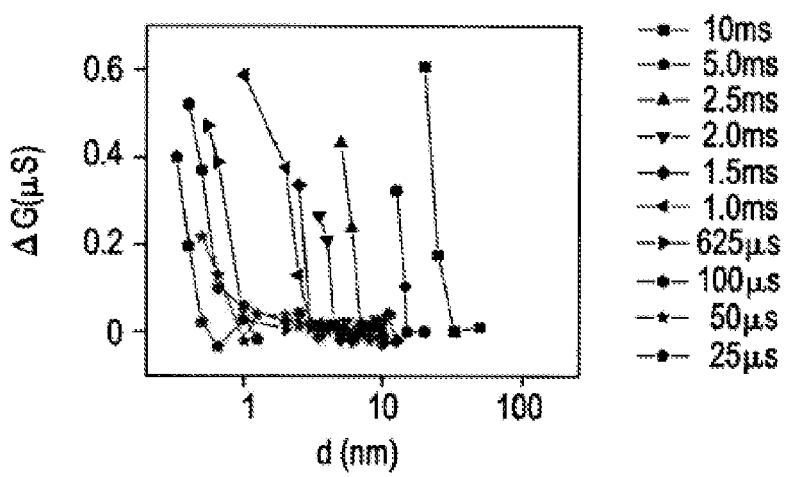
FIG. 3B is a graph of the conductance change as a function of dot spacing for an array of conductive quantum dots written using pulses of different durations and connecting the electrodes (30, 40).

FIG. 3B graphically depicts the resultant change in conductance as a function of separation distance "d" between dots for different durations of the pulse, ($t_{pulse}$) applied with the tip of the AFM. As seen in FIG. 3B, a sharp metal-insulator transition is observed as the dot spacing is reduced. For dot arrays created using pulses of longer duration, the metal-insulator transition occurs at a relatively larger separation distance "d," while for the arrays created with pulses of shorter duration, the metal-insulator transition occurs at a smaller separation distance "d" between dots. Thus, pulses of a short duration result in smaller dots which would allow a higher density of the conducting quantum dots to be created in a given area. This would translate to media (chips) capable of ultra high density data storage.

Figure 3C:
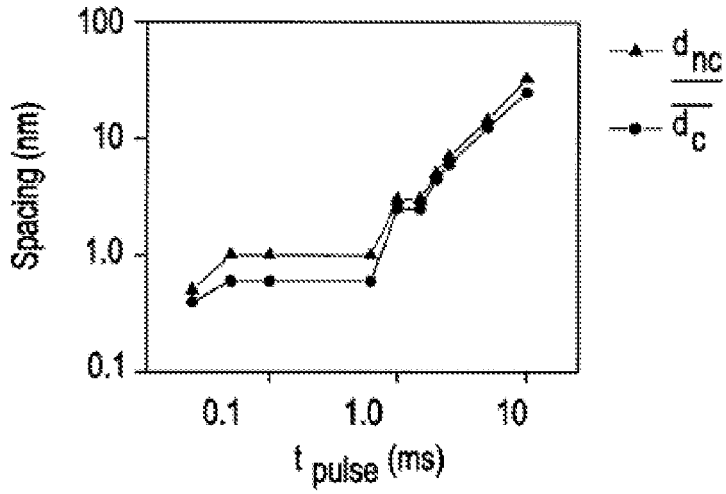
FIG. 3C is a plot of minimum dot spacing for which the array is non-conducting $d_{nc}$ and the maximum dot spacing for which the array is conducting $d_c$, presented as a function of pulse duration $t_{pulse}$.

FIG. 3C depicts plots of the smallest non-conducting spacing ($d_{nc}$) and the largest conducting spacing $d_c$ between dots as a function of $t_{pulse}$. The critical spacing for conduction "$d_c$" scales linearly with pulse duration until pulse durations of less than a millisecond are used ($t_{pulse}$<1 ms). Below this threshold for pulse duration, the critical spacing between dots in a linear array levels off at a distance $d_c$~1 nm.

By way of an example, it should be noted that a spacing between quantum dots of 7 to 15 nm corresponds to data storage capacity of >3 Tb/in². Since the embodiments provide dot spacing of less than 2 nm, an improvement over the magnetic storage materials currently used in hard disk drives is provided. In some embodiments, the method allows creating small size structures (e.g., nanowires and conductive quantum dots). Thus, one might call the embodiment a "nano-electronic sketchpad" or "quantum etch-a-sketch."

The width of the conducting wire can depend on the voltage of the AFM's tip ($V_{tip}$). Increasing $V_{tip}$ from 3 V to 10 V can increase the width of the conducting wire by three orders of magnitude. Test measurements have shown that the conductive wires created using an AFM tip remain stable over a 24 h time interval after the removal of the external electric field. Thus, it is possible to create nanoscale conducting structures in devices at room temperature using the method disclosed herein.

A "non-volatile" field-effect transistors (FET) can be provided. For example, the oxide heterostructure can be contacted with a set of electrodes at the interface of the two insulating layers. One electrode serves as the source while the second electrode functions as the drain of the FET. A conducting wire is written between the two electrodes and is in contact with the electrode at its opposite ends. The conducting tip of an AFM is then used to perturb the conductance through the application of an external electric field. In this case, the tip of the AFM acts as the "gate" of the FET.

Figure 4A:
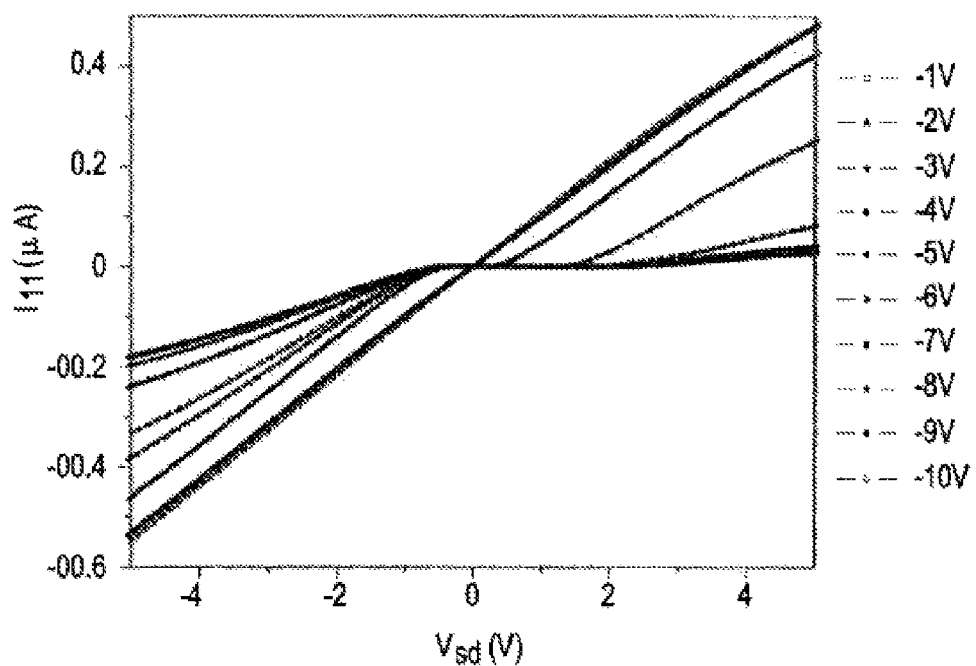
FIG. 4A is a plot of the current-voltage characteristics of a LaAlO$_3$/SrTiO$_3$-based device. The current $I_n$ between the electrodes (30, 40) is plotted as a function of the source-drain voltage ($V_{sd}$) for a 20 μm long q-1DEG wire with a potential barrier near the center and created with a negative gate bias $V_{gate}$. Different tip biases are represented. At sufficiently high tip bias, the I-V characteristic becomes strongly non-linear.
Figure 4B:
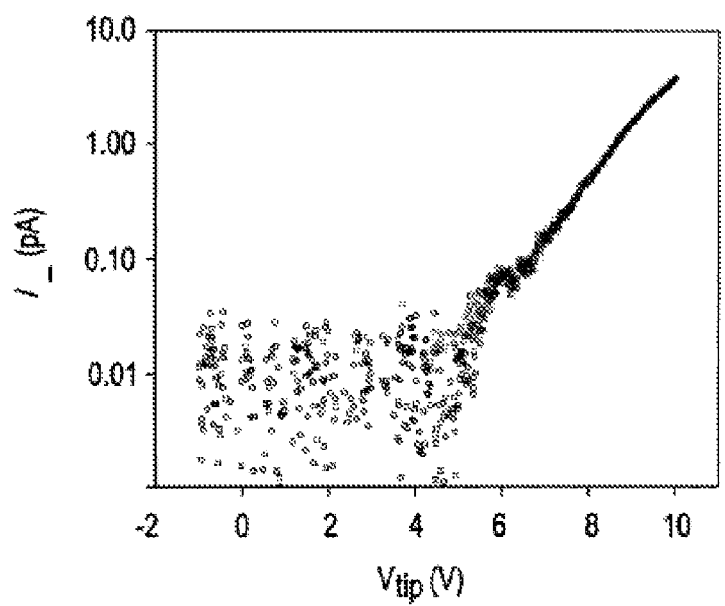
FIG. 4B is a plot of the AFM tip current $I_-$ versus tip voltage $V_{tip}$ with respect to grounded interface.

FIG. 4A shows the current-voltage (I-V) characteristics of a q-1DEG wire that is being perturbed by the AFM probe at varying voltages. Each curve in FIG. 4A represents a different applied voltage ($V_{gate}$) for the AFM probe. For each bias of the AFM tip, the in-plane current $I_{\parallel}$ is measured (using a picoammeter referenced to virtual ground) as a function of the source-drain voltage ($V_{sd}$) applied to one of the electrodes. At low $|V_{gate}|$, the conductance of the nano wire is unaffected. However, as the AFM tip bias becomes more negative (opposite to the writing voltage for the nano wire), the wire becomes insulating and conducts only above a finite bias. This turn-on bias increases monotonically with $|V_{gate}|$. Eventually the I-V curve becomes asymmetric, the probable origin of which is an asymmetry in the insulating barrier profile produced by unequal electric fields on both sides of the AFM tip. This effect is semi-permanent, however. The conducting nature of the wire can be restored by removing the AFM probe.

The methods disclosed herein allow creating exceptionally small sized electrically conductive regions in a reproducible manner using the tip of a conducting AFM as a source for applying the external electric field. For example, a voltage-biased AFM tip can be used to produce large local electric fields (E~$V_{tip}$/L) across the L=1.2-nm-thick LaAlO₃ barrier, although electron beam lithography or nanoscale electrodes placed in, over, or under one of the insulating layers can also be used in place of AFM to provide the external electric field. This permits creating exceptionally small-sized, q-1 or 0-dimensional electron gas regions with high spatial resolution.

Another embodiment of the invention relates to fabricating a nanowire that can itself act as a gate of a FET. The nanowire can be formed above, below, or on the sides of a transistor channel region, and separated from the conducting channel by a layer of insulating material, such as the perovskite insulating layer on which the nanowires are formed. The gate nanowire can be connected to a voltage or current source, such as a conductive pad connected to a voltage or current source or to a gate driver circuit. Additionally, the channel may comprise a semiconductor region in a semiconductor layer that is located adjacent to the nanowire. Alternatively, the channel can be another q-1DEG nanowire located adjacent to the "gate" nanowire. In this set-up, the "channel" nanowire can be connected to the source and drain electrodes, which may comprise other conductive pads connected to a voltage or current source or to a bit line driver circuit.

Pursuant to some embodiments, material systems wherein the LaAlO₃/SrTiO₃ oxide heterostructure is grown on silicon, and a nanowire is used as a gate to form very high mobility devices in silicon-on insulator or strained silicon-on insulator platforms.

The embodiments also provide various uses for the LaAlO₃/SrTiO₃ material systems for technological applications in, for example, the use of devices in silicon-on insulator, strained silicon-on insulator or germanium-on insulator platforms as ultra-high density non-volatile data storage devices, as single electron transistors, or the use of the devices for a variety of quantum computing applications.

Further embodiments are generally described by reference to the following examples which are illustrative only and are not intended to be limiting.

Example Related to Ultrahigh Density Patterning of Conducting Media

The oxide heterostructure can be made by growing a LaAlO₃ layer on a TiO₂ terminated insulating SrTiO₃ substrate at 770° C. in an oxygen atmosphere at a pressure of 6×10⁻⁵ mbar using pulsed laser deposition. The samples are then cooled to 600° C. in the presence of oxygen at a pressure of 400 mbar for 1 h to give the material system comprising an oxide heterostructure. The thickness of the LaAlO₃ layer was varied based on the requirements for the measurements to be performed.

Control experiments were performed on 4 unit cells ("uc") LaAlO₃/SrTiO₃ and 2 uc LaAlO₃/SrTiO₃, and 0 uc LaAlO₃/SrTiO₃ (i.e., bare SrTiO₃) samples. Each of these samples was grown and contacted in a manner identical to that described for the 3 uc LaAlO₃/SrTiO₃ with the exception of the bare SrTiO₃, on which LaAlO₃ was not grown. A summary of results for all four samples (including 3 uc LaAlO₃/SrTiO₃) is provided in Table 1.

Photosensitivity.

The conductance of the 3 uc LaAlO₃/SrTiO₃ sample is highly sensitive to light above the bandgap of SrTiO₃ (~3.2 eV). The 3 uc LaAlO$_3$/SrTiO$_3$ sample exhibits a persistent photoconductivity that decays over ~12-24 hours after being stored in a dark environment. The 4 uc sample showed a similar photosensitivity, but the 2 uc and 0 uc samples did not exhibit photosensitivity.

Background Conductance:

The 0 uc, 2 uc, and 3 uc samples exhibited very small background conductance of several nS, while the 4 uc sample showed a much larger background conductance (~1200 nS).

Writing Conducting Regions:

Two methods of writing were demonstrated with the 3 uc sample: (1) writing of isolated structures that are later contacted and (2) writing of structures beginning from one or both electrodes. Writing (using either method) for the 4 uc sample is possible although the large conductance of the interface requires the voltage threshold for writing to be higher compared to the 3 uc sample. Isolated conducting structures could not be written on either the 2 uc or the 0 uc sample. Attempts to write conducting lines beginning from one of the electrodes and ending at the other were unsuccessful in that any resulting conductance change coincided with highly visible damage to the sample surface, taking the form of a 1-2 nm protruding line that follows the path taken by the AFM tip. It should be further noted that writing for the 3 uc or 4 uc samples did not produce any observable topographic changes.

Erasing Conducting Regions:

In the 3 uc sample conducting regions became insulating after being erased by the application of a reverse voltage (−10 V). However, for the 4 uc sample, only changes in the conductance were observed after several attempts to erase the conducting region. The interface, however, remains conducting regardless of the bias applied. See, also, FIGS. 3B and 3C discussed above.

Examples Related to Oxide Nanoelectronics on Demand

Nanoscale lateral confinement of a quasi-two-dimensional electron gas at the LaAlO$_3$/SrTiO$_3$ interface is provided. Such confinement of quasi-two-dimensional electron gas can be used to create a variety of electronic devices. Field-effect transistors can be formed with characteristic dimensions of about two nanometers. The devices can be modified or "erased" without the need for complex lithographic procedures. The on-demand nanoelectronics fabrication platform disclosed herein has the potential for widespread technological application.

Controlling electronic confinement in the solid state is increasingly challenging as the dimensionality and size scale are reduced. Bottom-up approaches to nanoelectronics utilize self-assembly and templated synthesis, e.g., junctions between self-assembled molecule layers metallic and semiconducting quantum dots, carbon nanotubes, nanowires, and nanocrystals. Top-down approaches retain the lithographic design motif used extensively at micron and sub-micron scales and make use of tools such as electron-beam lithography, atomic-force microscopy (AFM), nanoimprint lithography, dip-pen nanolithography, and scanning tunneling microscopy. Among the top-down approaches, those which begin from modulation-doped semiconductor heterostructures, for example, have led to profound scientific discoveries.

The interface between polar and non-polar semiconducting oxides displays remarkable properties reminiscent of modulation-doped semiconductors. When the thickness of the polar insulator (e.g., LaAlO$_3$) exceeds a critical value, the potential difference across LaAlO$_3$ will generate a "polarization catastrophe," due to the polarization discontinuity at the interface, and induce the formation of a quasi-two-dimensional electron gas (q-2DEG) at the interface joining the two insulators. In addition to the key role played by the polar discontinuity, there is evidence that, when present, oxygen vacancies in the SrTiO$_3$ also contribute to the formation of the electron gas.

Due to the large conduction-band offset between LaAlO$_3$ and SrTiO$_3$, the q-2DEG is confined largely within the first few unit cells of SrTiO$_3$, with very little penetration into the LaAlO$_3$ layer. Electric fields have been used to control the metal-insulator transition at room temperature and the superconductor-insulator transition at cryogenic temperatures. Further in-plane confinement of the q-2DEG has been achieved by lithographically modulating the thickness of the crystalline LaAlO$_3$ layer. Control over the metal-insulator transition at <4 nm scales was demonstrated using a conducting AFM probe.

Writing and Erasing.

Figure 8:
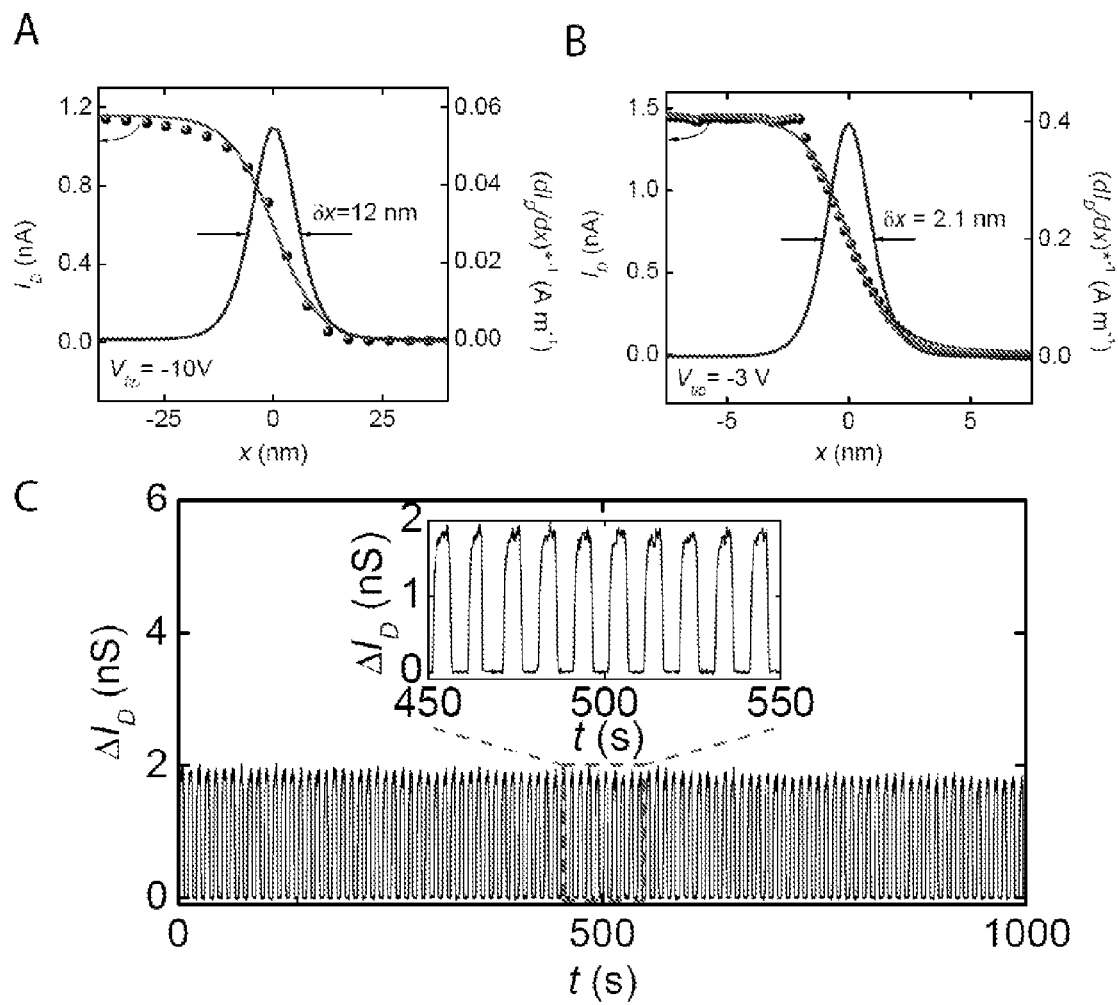
Figure 11:
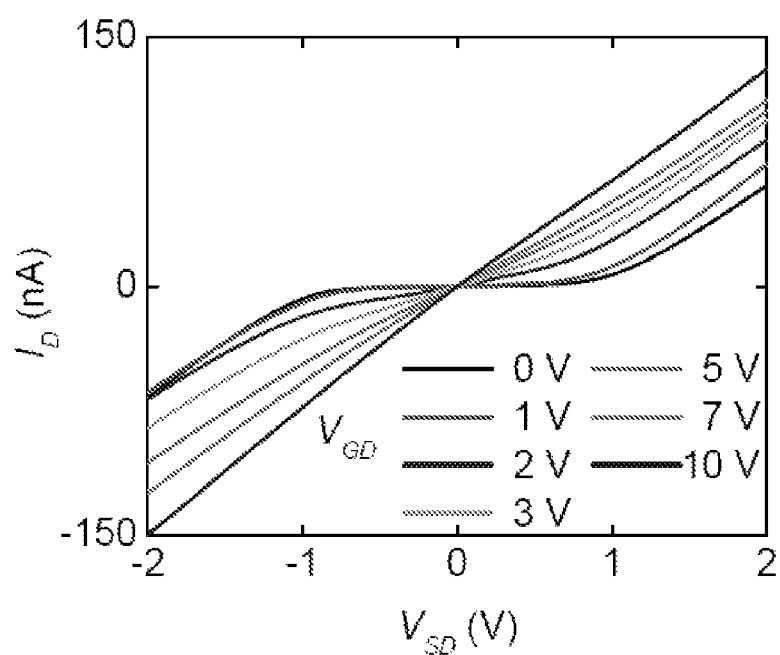
FIG. 11 illustrates I-V characteristics of a SketchFET with a larger barrier. Drain current $I_D$ is plotted as a function of source bias $V_{SD}$ at various gate biases $V_{GD}$, showing a more pronounced field effect.

Based on the experimental finding that nanoscale conducting regions can be created and removed (erased) using voltages applied by a conducting AFM probe, various multi-terminal devices are constructed. In one embodiment, a device is provided comprising nominally 3.3 unit cells (uc) of LaAlO$_3$. A conducting AFM tip is scanned along a programmed trajectory (x(t), y(t)) with a voltage V$_{tip}$(t) applied to the tip. Positive tip voltages above a threshold V$_{tip}$>V$_t$~2-3 V produce conducting regions at the LaAlO$_3$/SrTiO$_3$ interface below the tip of the AFM. The lateral size δx of this conducting nanoregion increases monotonically with tip bias. Typical values are δx=2.1 nm and δx=12 nm at V$_{tip}$=+3 V and at +10 V, respectively (FIGS. 11A, 11B). Subsequent erasure of the structures can be induced by scanning with a negative voltage or by illuminating with light of photon energy E>E$_g$. Structures can be "written" and "erased" hundreds of times without observable degradation (FIG. 8C). The structures shown here are "written" within the same working area; similar structures have been created and measured for other electrode sets, with consistent results.

Designer Potential Barriers.

Figure 5:
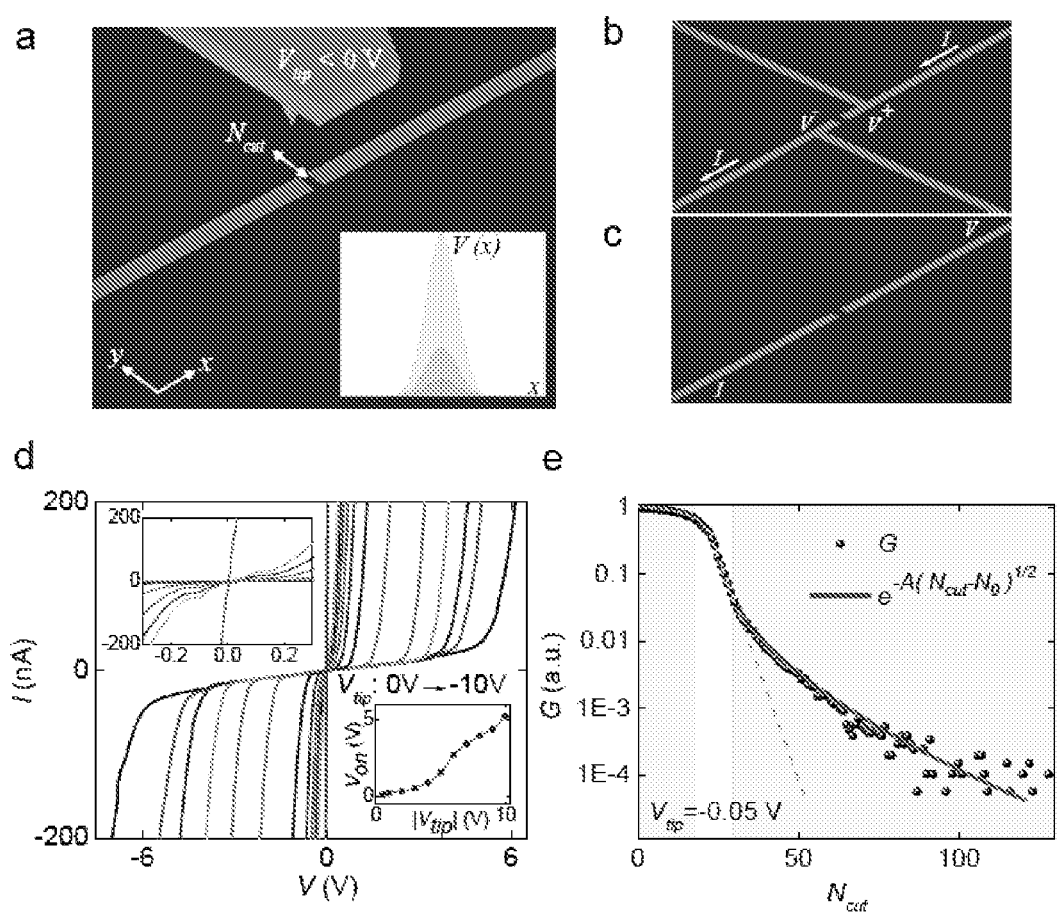
FIGS. 5A-5E illustrate the creation of nanoscale tunnel barriers.

The writing and erasing process allows for remarkable versatility in producing quantum-mechanical tunneling barriers (FIG. 5A). The transport properties of these tunnel barriers are investigated in two different experiments. Both begin with w~12 nm wide nanowires written with a positive tip voltage V$_{tip}$=+10 V. In the first study, a four-terminal transport measurement is performed. A current (I) is sourced from two leads, while a second pair of sense leads is used to measure the voltage (V) across a L=2 μm section at the middle of the nanowire (FIG. 5B). As prepared, the nanowire is well conducting (R$_0$=147 kΩ, corresponding to a conductivity σ=6.8 μS) (upper inset of FIG. 5d). This conductivity together with its the aspect ratio a (length/width=160) corresponds to a sheet conductance σ$_S$=1.1×10$^{-3}$ S, which is ~200× larger than that of the unstructured film (σ$_S^{film}$≈5×10$^{-6}$ S).

A negatively biased tip (V$_{tip}$<0 V) is then scanned across the wire. I-V curves are acquired after each pass of the tip. Scanning with a negative bias restores the insulating state, presumably by shifting the local density of states in the SrTiO$_3$ upward in energy, thus providing a barrier to conduction (FIG. 5A inset). Hereby, the tip bias starts at V$_{tip}$=−0.5 V and then increases linearly in absolute numbers (−1 V, −2 V, −3 V, . . . −10 V). All I-V characteristics are highly nonlinear (FIG. 5D), showing vanishing conductance at zero bias, and a turn-on voltage V$_{on}$ (defined as the voltage for which the current exceeds 10 nA) that increases monotonically with tip voltage (lower inset of FIG. 5D). A small residual conductance (4.1 nS) is observed which is independent of V$_{tip}$ and hence associated not with the nanowire and tunnel barrier but with an overall parallel background conductance of the heterostructure.

In the second study, the conductance of a nanowire is measured as the AFM tip is scanned repeatedly across the wire with a relatively small fixed negative bias $V_{tip}=-50$ mV (FIGS. 5A, 5C). With each pass of the AFM tip, the conductance decreases monotonically, exhibiting three qualitatively distinct regimes (FIG. 5E). For $N_{cut}<10$, it can be observed that the conductance reduces only slightly with each pass. For $10<N_{cut}<25$ the behavior transitions to one in which the conductance decays approximately exponentially with $N_{cut}$. For $N_{cut}>25$, a clear deviation from this straight exponential falloff can be observed. The AFM probe can be gradually increasing the potential barrier between the nanowire leads. While this process must eventually saturate for large $N_{cut}$, for the regime explored the potential appears to scale linearly with $N_{cut}$, as evidenced by the observed dependence of the conductance with $N_{cut}$ over many experiments (FIG. 5E). Along the center of the wire, the induced potential after $N_{cut}$ passes can be described by an effective potential: $V_N(x)=V_0+N_{cut}V_b(x)$ where $V_b(x)$ is a sharply peaked (~2 nm-wide) function of position. The conductance of the nanowire measured as a function of $N_{cut}$ (FIG. 5E) shows evidence for a crossover from a highly conducting regime ($N_{cut}<10$) to an exponential thermal hopping regime ($10<N_{cut}<25$) to one dominated by quantum-mechanical tunneling through the barrier ($N_{cut}>25$). The latter non-exponential form is consistent with a tunneling probability $t \propto \exp[-A'\sqrt{V-E_F}]$, as can be seen by a comparison with the functional form $G \propto \exp[-A\sqrt{N_{cut}-N_0}]$. In this case, the barrier written by the AFM tip can act as a tunnel junction that interrupts the written nanowires.

SketchFET.

Figure 6:
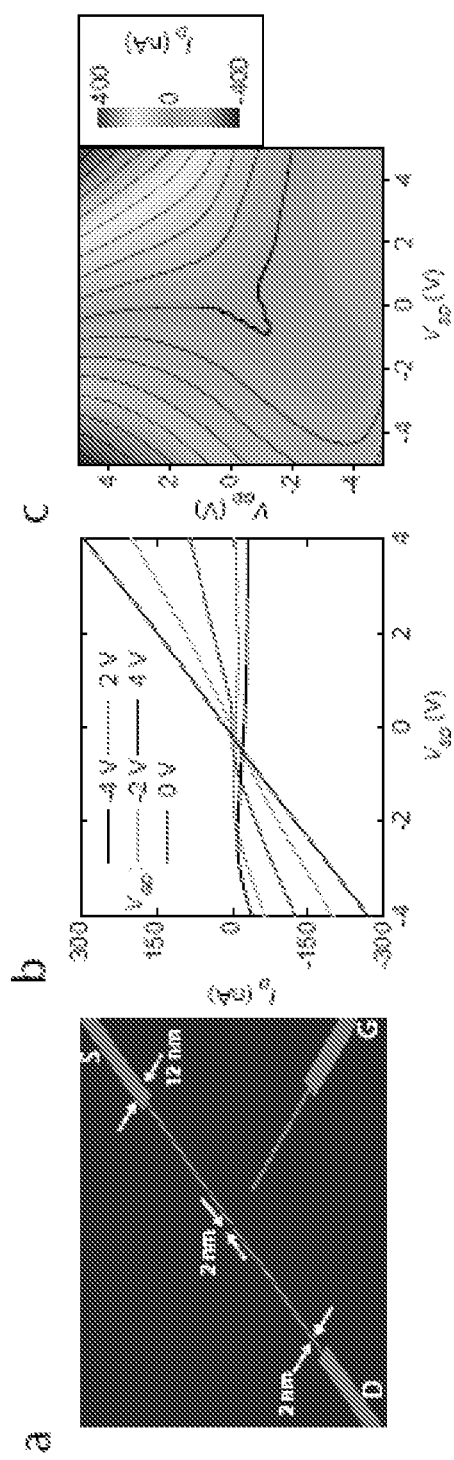
FIGS. 6A-6C illustrate the SketchFET device.
Figure 9:
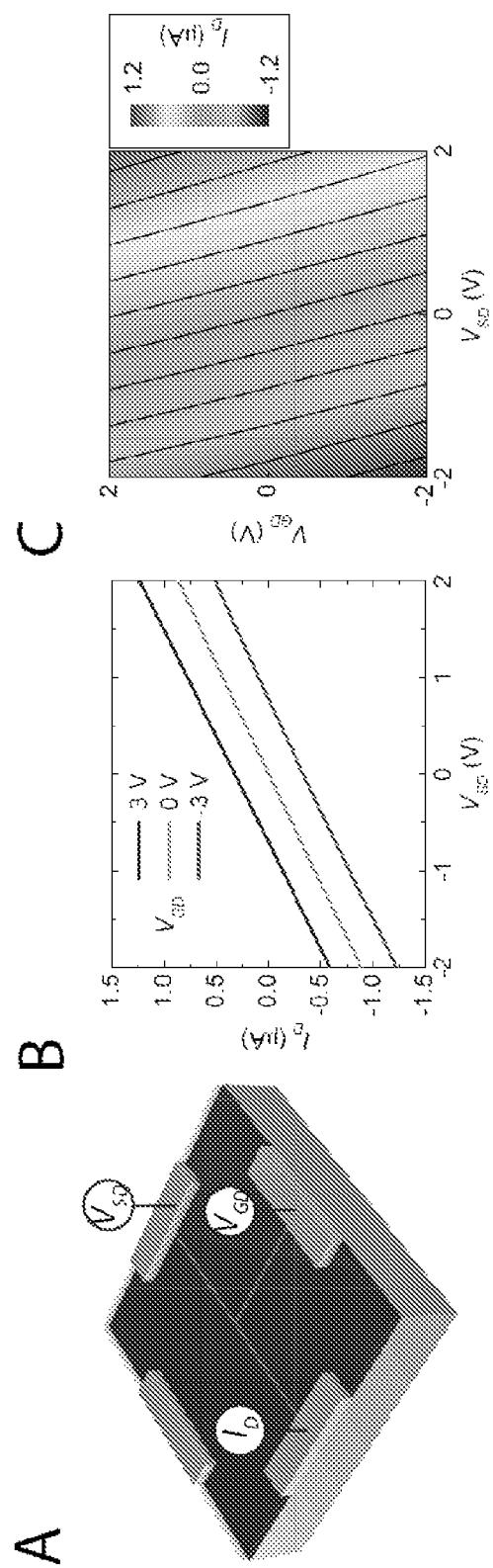
FIG. 9A shows a perspective view of a T-Junction.
FIG. 9B shows linear I-V characteristic between source and drain at different gate bias ($V_{GD}=-3$ V, 0 V, 3 V). The behavior can be well described by a simple resistive network.
FIG. 9C shows further currents between source and drain under various $V_{GD}$ and $V_{GD}$.

The ability to produce ultrathin potential barriers in nanowires enables the creation of field-effect devices with strongly nonlinear characteristics. Two families of such devices are demonstrated here. Both begin with a "T-junction" of nanowire leads written with $V_{tip}=10$ V (w ~12 nm) (FIG. 9A). As constructed, the T-junction behaves as a simple resistive network (FIG. 9B). The creation of the first device (FIG. 6A) begins with erasing the central region (within 1 µm from the center) of a T-junction of source (S), gate (G), and drain (D) electrodes and then re-connecting the channels with $V_{tip}=3$ V (w ~2 nm), followed by a subtractive step in which the AFM probe is scanned under negative bias ($V_{tip}=-3$ V), starting from the center of the junction across the source-drain channel and moving a gap distance $g_2=50$ nm along the direction of the gate electrode. This step also creates a $g_1=2$ nm barrier between source and drain. The asymmetry in the two gaps (FIG. 10A) enables the gate electrode to modulate the source-drain conductance with minimal gate leakage current. This device can be referred to as a Sketch-defined Electronic Transport within a Complex-oxide Heterostructure Field-Effect Transistor (SketchFET).

Figure 10:
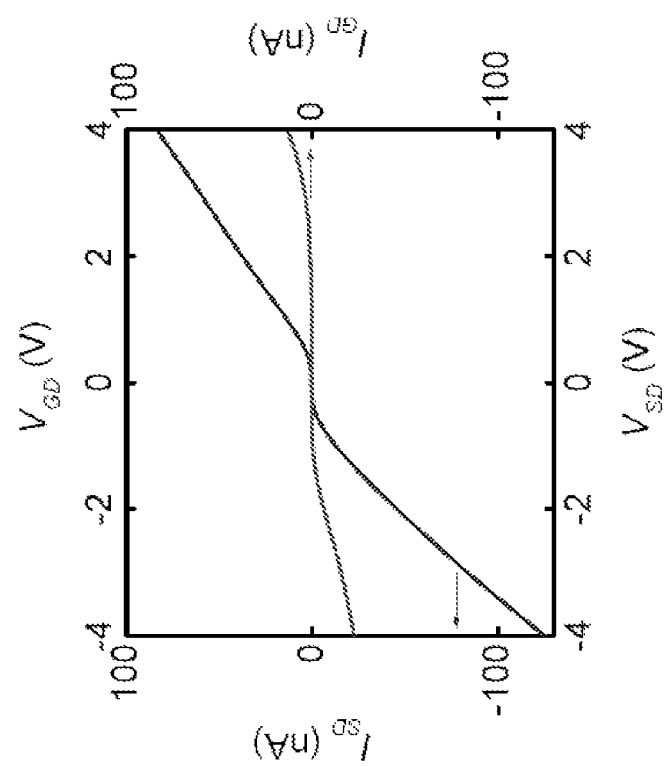
FIG. 10 illustrates, for the SketchFET structure, I-V characteristic between source and drain ($I_{SD}$) plotted together with I-V characteristic between gate and drain ($I_{GD}$).

Transport measurements of this SketchFET are performed by monitoring the drain current $I_D$ as a function of the source and gate voltages ($V_{SD}$) and $V_{GD}$, respectively). Both $V_{SD}$ and $V_{GD}$ are referenced to the drain, which is held at virtual ground. At zero gate bias, the I-V characteristic between source and drain is highly nonlinear and non-conducting at small $|V_{SD}|$ (FIG. 6B). A positive gate bias $V_{GD}>0$ lowers the potential barrier for electrons in the source and gate leads. With $V_{GD}$ large enough ($\geq 4$V in this specific device), the barrier eventually disappears. In this regime, ohmic behavior between source and drain is observed. This field effect in this case is non-hysteretic, in contrast to field effects induced by the AFM probe. At negative gate biases the nonlinearity is enhanced, and a gate-tunable negative-differential resistance (NDR) is observed for $V_{SD}>-2.5$ V. When a sufficiently large gate bias is applied, a small gate leakage current $I_{GD}$ also contributes to the total drain current $I_D$ (FIG. 10A). The NDR regime is associated with this gate leakage current as discussed in more detail below.

By increasing the source-drain gap ($g_1=12$ nm) of the SketchFET (FIG. 11), the source-drain characteristic becomes more symmetric. However, this structure requires a larger positive gate bias to switch the channel on. Tunneling through such a wide barrier width is unusual, but it is assisted by the triangular nature of the tunneling barrier under a large applied fields (E~MV/cm), and the barrier width is renormalized by the large dielectric constant of $SrTiO_3$ ($\in$~300 at room temperature).

One application of FETs is making logic elements. The applied values of $V_{SD}$, $V_{GD}$ can be interpreted as "on" (>4 V) or "off" (<4 V) input states of a logic device, the measured values of $I_D$ can be understood as "on" (>200 nA) or "off" (<200 nA) output states. A full exploration of $I_D(V_{SD},V_{GD})$ reveals an "AND"-functionality (e.g. output is "on" only when both inputs are "on") (FIG. 6C). Due to the nonlinear character of the junction, the resultant drain current when both $V_{SD}$ and $V_{GD}$ are "on" is approximately three times the sum of the individual contributions when only one input is "on": $I_D(4V, 4V)$~$3(I_D(4V, 0V)+I_D(0V, 4V))$, which yields a promising on-off current ratio.

Frequency Response.

Figure 12:
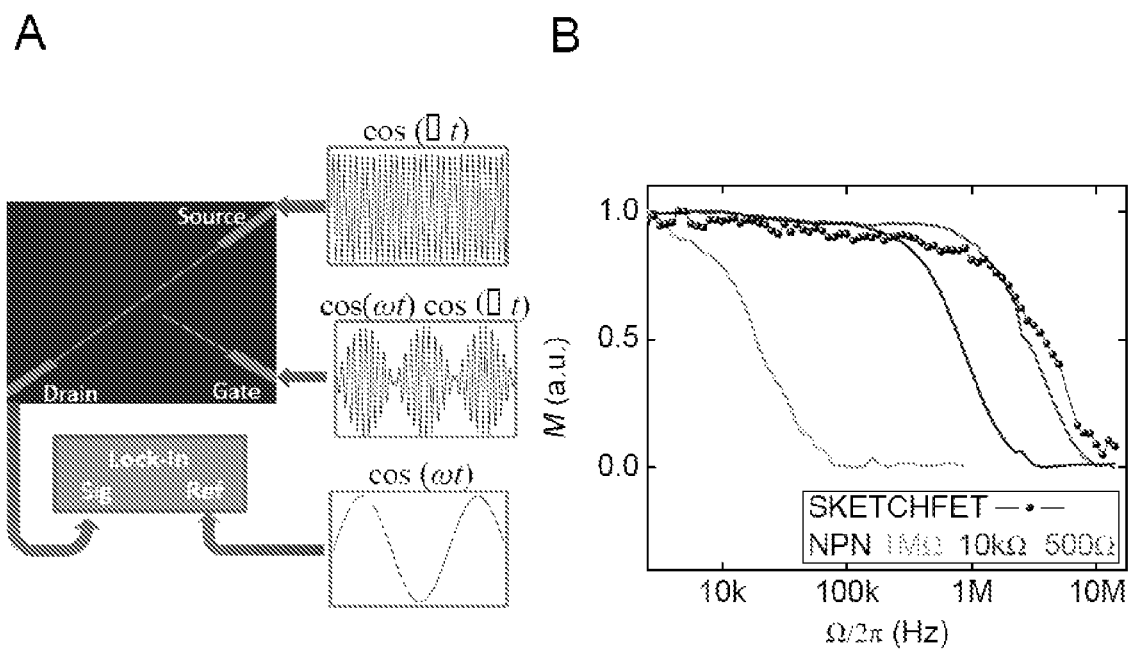
FIG. 12A is a schematic diagram of frequency response measurement.
FIG. 12B shows normalized frequency response of SketchFET and a commercial NPN small signal transistor (cut-off frequency is 900 MHz) with no external resistor and resistors of 500Ω, 10 kΩ, or 1 MΩ connected in series with the emitter.
Figure 13:
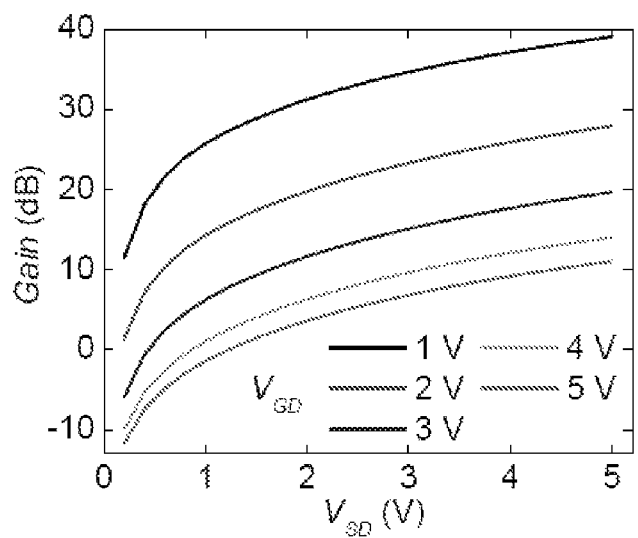
FIG. 13 illustrates power gain of a SketchFET structure as a function of source bias $V_{SD}$ plotted for various values of the gate bias $V_{GD}$.

One gauge of the performance of a transistor is its ability to modulate or amplify signals at high frequencies, as quantified by the cutoff frequency $f_T$. The frequency dependence of the SketchFET described in FIG. 6 can be characterized using a heterodyne circuit that incorporates the SketchFET as a frequency mixer. The experimental arrangement is shown schematically in FIG. 12A. The results of this heterodyne measurement over a frequency range 3 kHz<$\Omega/2\pi$<15 MHz show that the SketchFET operates at frequencies in excess of 5 MHz. In the measurement setup used, this frequency is most likely limited by the large (~M$\Omega$) resistance of the three leads connecting to the device. The high mobility of the channel and the fact that the I-V characteristics are far from saturation in the conducting regime suggest that $f_T$ of the SketchFET, without the large lead resistances, could extend into the GHz regime.

As Si technology reaches fundamental physical limitations, researchers and funding agencies are looking to move Beyond Moore's Law in terms of new materials and devices. Transistors that operate at GHz frequencies using "non-traditional" materials have recently been demonstrated with carbon-based electronics. Although graphene is capable of very high frequency (100 GHz) signal amplification, there are problems associated with modulation to realize logic operations. Transistors created at $LaAlO_3/SrTiO_3$ interfaces are able to be completely switched between "on" and "off" states, and the high frequency operation shown here enables associated computational applications.

Figure 16:
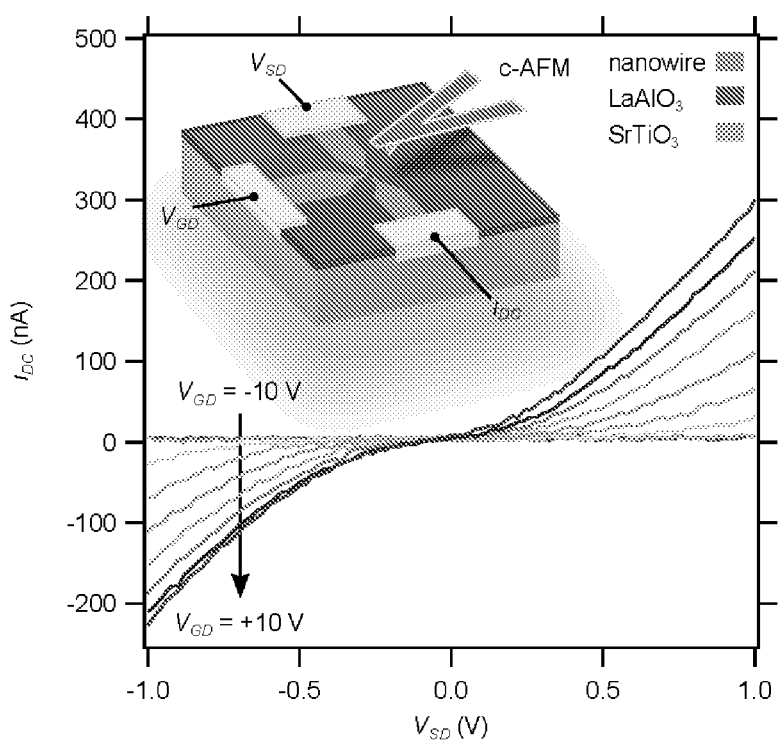
FIG. 16 illustrates DC current ($i_{Dc}$) as a function of source ($V_{SD}$) and gate ($V_{GD}$) bias, demonstrating the ability to change the channel conductance between on ($V_{GD}=+10$ V) and off ($V_{GD}=-10$ V) states. The inset shows nanowire writing at the LaAlO$_3$/SrTiO$_3$ interface. Buried Au electrodes are directly contacted to the interface. A positive voltage applied to the conducting atomic force microscope (c-AFM) probe will locally switch the interface to a conducting state, while a negative voltage will locally restore the insulating state.

The operation of nanoscale $LaAlO_3/SrTiO_3$-based transistors at GHz frequencies can be demonstrated. Initial characterization is done by measuring the DC current as a function of source and gate biases, $V_{SD}$ and $V_{GD}$ respectively (FIG. 16). As these are n-type devices, a negative $V_{GD}$ will inhibit conduction while a positive $V_{GD}$ will enhance it. Characterization of the SketchFET functionality at high frequencies is performed using a heterodyne circuit in which the SketchFET is used as a frequency mixer, as shown schematically in FIG. 17a. Two RF generators independently drive the source and gate electrodes (i.e., RF and LO ports) with continuous wave frequencies of f and f+df, respectively. The two RF generators are synced using their time bases. Bias tees are used to supply DC voltages to each electrode. The current collected from the drain electrode (IF port) is measured on a lock-in amplifier at the difference frequency df. Measurements of $i_D$ are performed as a function of f between 100 kHz and 1 GHz, as well as $V_{SD}$ and $V_{GD}$. A typical value of df is 977 Hz. Because of the background-free nature of this measurement, only in the situation where the SketchFET operates as a frequency mixer will there be a signal of frequency df at the drain electrode.

Figure 17:
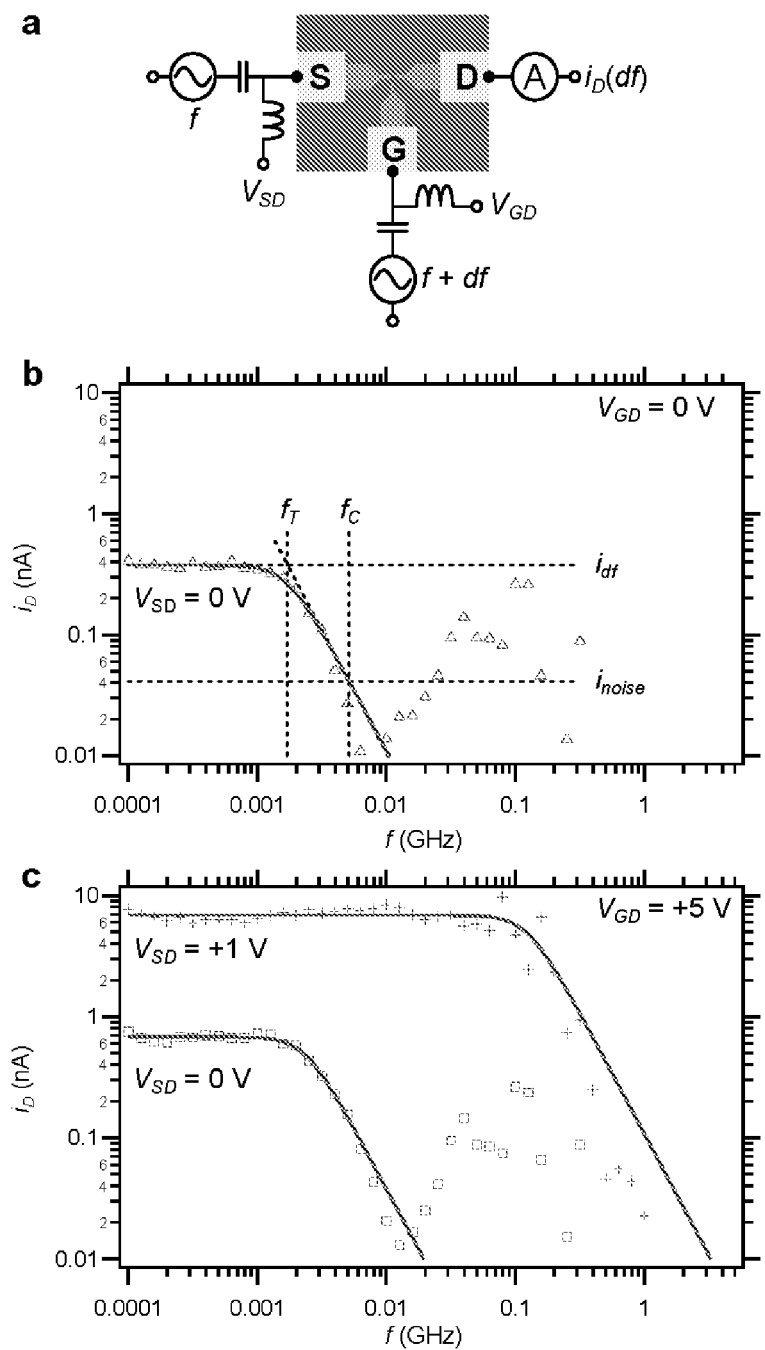

A typical current vs. RF frequency curve is shown in FIG. 17b. The devices exhibit a uniform response as a function of f up to a transition frequency $f_T$, after which the current begins to fall off as $1/f^2$. There exists an RC time constant between the source and drain and also between the gate and drain. If each one falls off as $1/f$, when combined this leads to the observed $1/f^2$ dependence. Therefore, the drain current $i_D$ as a function of f is well-described by a function modeled after a two-pole, low-pass RC filter, $i_D(f) = i_{df}(1+(f^2/f_T^2)^2)^{-1/2}$, where $i_{df}$ is the low-frequency response current. It is noted that in some cases $i_D$ goes back up after falling off. This may be due to the impedance not being well-matched between the RF lines (R~50 Ohms) and the SketchFET (R~100 MOhms) device, which can result in unpredictable behavior such as resonances and reflections.

As shown in FIG. 16, a large, negative gate bias will extinguish the conductivity in the source-drain channel. Similarly, a large, negative bias will also inhibit the AC conductivity: the current measured in such a situation ($i_D@V_{GA}<<0$ V) can be defined as the noise floor noise. The cutoff frequency $f_C$ can be defined as the RF frequency at which the drain current is equal to the noise floor ($i_D = i_{noise}$). The DC biases applied to the source and gate electrodes can be used to turn on and off the device and to tune the frequency response (FIG. 17c). These parameters at several bias conditions are summarized in Table 2. When the SketchFET is in the most conducting state ($V_{SD}$; $V_{GD}>0$ V) $f_C$ reaches its maximum value.

Figure 18:
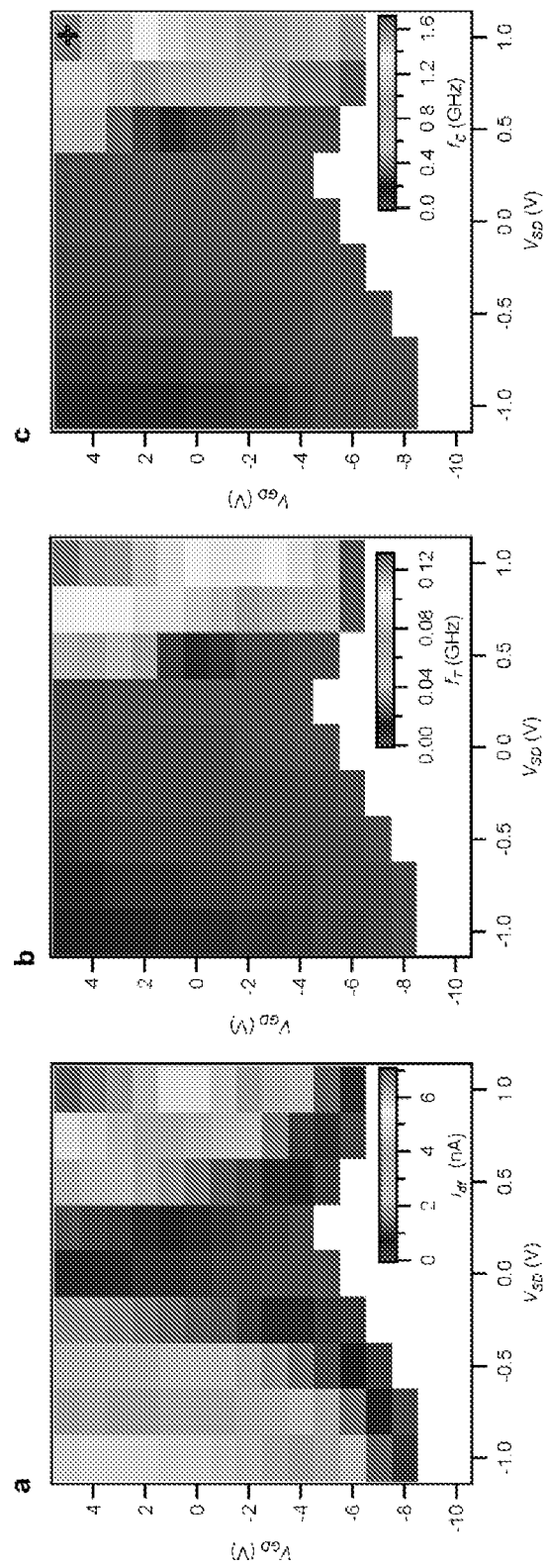
FIG. 18A is an intensity plot of fitting parameters $i_{df}$ as a function of $V_{SD}$ and $V_{GD}$.
FIG. 18B is an intensity plot of fitting parameters $f_T$ as a function of $V_{SD}$ and $V_{GD}$.
FIG. 18C is an intensity plot of fitting parameters $f_C$ as a function of $V_{SD}$ and $V_{GD}$. The symbols represent the bias conditions shown in FIGS. 18B and 18C and in Table 2. $P_{RF}=0$ dBm.

Two dimensional intensity plots of the parameters $i_d$, f, $f_T$, and $f_C$ are shown in FIG. 18. White boxes are shown for bias conditions at which the response goes to zero and therefore fits are not meaningful. It is also noted that the measurements are only sensitive to the magnitude of $i_D$ when performing the heterodyne measurement. As expected, $i_D$ depends monotonically with $V_{SD}$. Here, the bias dependence mirrors the DC current dependence in that the high frequency response is extinguished at large, negative values of $V_{GA}$. More surprising is that $f_T$ and $f_C$ also vary monotonically with $V_{SD}$, with the highest frequency operation occurring at the largest positive voltages. The anisotropy of these parameters observed as a function of $V_{SD}$ is consistent with the DC response of the device, indicating the existence of a non-symmetric potential barrier between the source and drain.

Typical studies of high frequency performance use a network analyzer circuit to drive the device at frequency f in order to measure the small-signal current gain $h_{21}$. Because in these devices strong modulation can be performed, that is the conductance can be completely extinguished, both the gate and source electrodes can be driven at frequencies f and f+df and look at the nonlinear response at df. For this reason, a frequency dependence of $1/f^2$ above $f_C$, rather than $1/f$, can be observed when measuring the hybrid parameter $h_{21}$. Extrapolating the $1/f^2$ dependence results in a cutoff frequency as high as 1.6 GHz. A $1/f$ rolloff should result in a higher cutoff frequency.

The high conductance of the 12 nm wires, produced by the large (~100 MV/cm) transient electric field of the AFM probe, is metastable and prone to partial relaxation toward the unpatterned q-2DEG value on a timescale that depends on the ambient environmental conditions. Experiments performed on a SketchFET stored under vacuum conditions show a non-exponential decay of the overall conductance (dominated by that of the 12 nm leads) toward a steady-state value that is comparable to the sheet conductance of the unpatterned film. No discernable degradation in the SketchFET switching performance is observed over a nine-day period. The extreme sensitivity of electron tunneling to barrier thickness demonstrates that the SketchFET and related structures are stable on length scales small compared to their feature size (e.g., 2 nm gap) and time scales significantly longer than the observation period.

The nanoscale structures described above are representative of a new and versatile family of nanoelectronic devices operating at the interface between a polar and non-polar oxide insulator. The conducting nanostructures have dimensions that are comparable to single-walled carbon nanotubes, yet they can be freely patterned and repeatedly modified. The devices demonstrated herein also suggest many other possible applications and research directions.

Figure 15:
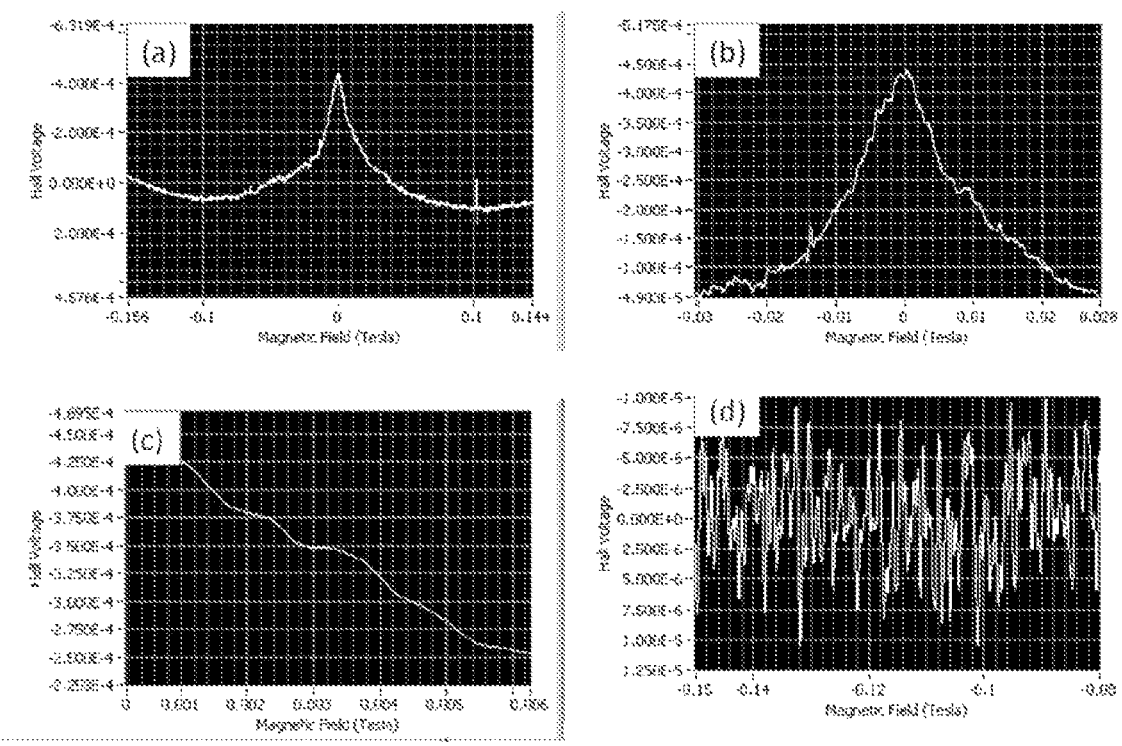
FIG. 15A shows the Hall voltage for the structure shown in FIG. 14A at T=20 mK.
FIG. 15B shows a close-up view of the Hall voltage curve illustrating sensitivity of the Hall voltage to small magnetic fields.
FIG. 15C shows a further close-up view of the Hall voltage curve, where the slope of the curve in quantifies how rapidly the Hall voltage changes with the applied magnetic field.
FIG. 15D shows noise in Hall signal measured away from the peak, used to calculate the signal-to-noise for this system.

Supplemental Information related to Frequency Response of SketchFET (See, e.g., FIG. 15)

A small-amplitude ($V_{SO}$~100 mV) sinusoidal bias signal $V_S(t) = V_{SO}\cos(\Omega t)$ is applied to the source. The gate signal is derived by amplitude modulating at a low frequency: $\omega/2\pi = 1.248$ kHz: $V_G(t) = \cos(\omega t)V_S(t) = V_{SO}(\cos(\Omega_+ t) + \cos(\Omega t))$ where $\Omega_\pm = \Omega \pm \omega$. The resulting drain current ID is measured by a lock-in amplifier at the reference frequency $\omega/2\pi$. Detection of a non-zero component of $I_D$ at frequency $\omega/2\pi$ arises due to signal mixing by the transistor, i.e., $I_D(t) \sim g(\Omega_+)\cos(\Omega_+ t)\cos(\Omega t) + g(\Omega_-)\cos(\Omega_- t)\cos(\Omega t) + I_{\Omega, \Omega_+,\Omega_-} = M(\Omega)\cos(\omega t) + $ higher frequency terms. The mixing strength M characterizes the frequency response of the SketchFET.

Figure 7:
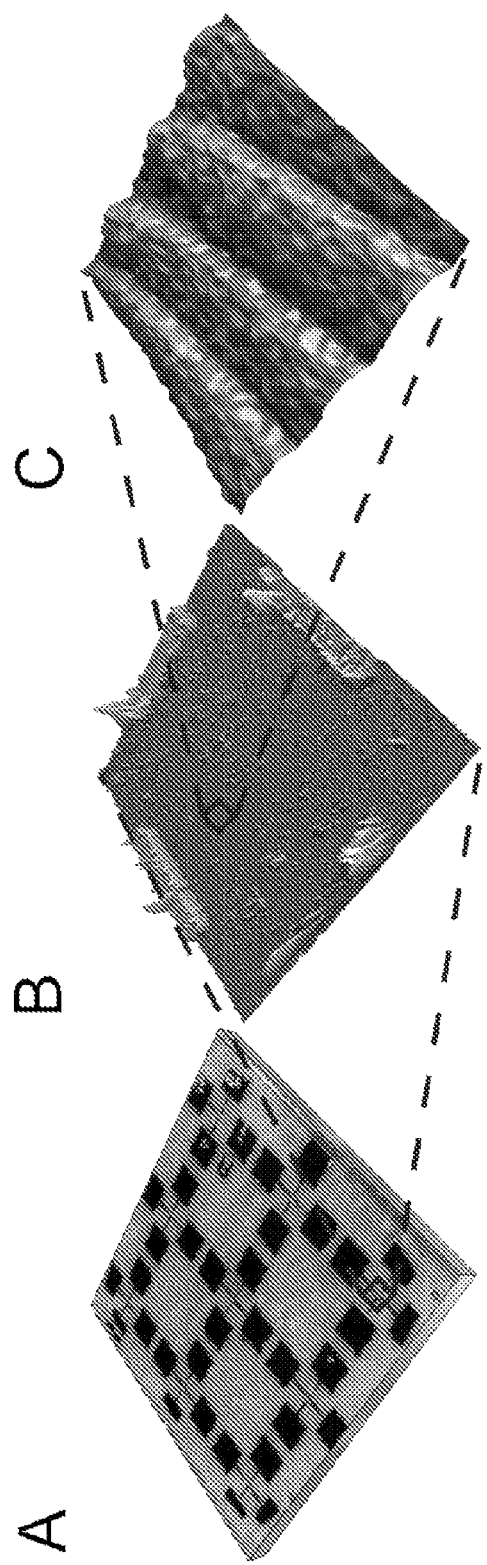
FIG. 7A is a 5 mm×5 mm optical image of LaAlO$_3$/SrTiO$_3$ structure with nine electrode sets.
FIG. 7B is a 50 μm×50 μm AFM image showing ends of four Au electrodes and central writable area.
FIG. 7C is a 1 μm×1 μm AFM image showing ~3 Å terrace structure due to the substrate miscut.

The source-gate capacitance can be estimated from the cutoff frequency using $1/f_T = 2\pi R_S(C_{SG}+C_{DG})$. By measuring the I-V characteristic of a T-junction with 12 nm wide lead of same size as SketchFET (FIG. 7), it can be estimated that the typical value of the lead resistance $R_S = 1$ MΩ, together with $f_T = 5$ MHz, and obtain $C_{SG} \approx C_{DG} \approx 20$ fF. For comparison, a commercial NPN small signal transistor (Central Semiconductor Corp. 2N709A) is characterized with various resistances $R_e = 500\Omega$, 10 kΩ, and 1 MΩ connected in series with the emitter. This transistor has a specified $f_T$ of 900 MHz and collector-base capacitance $C_{cb}^{spec} = 3$ pF. By increasing $R_e$, $f_T$ drops monotonically, eventually scaling according to $f_T = (2\pi R_e C_{cb})^{-1}$. When $R_e = 1$ MΩ, $f_T$ is 20 kHz, calculated $C_{cb}^{meas} = 8$ pF in reasonably good agreement with the manufacturer's specifications.

Examples Related to Nanoscale Rectification

Control over electron transport at scales that are comparable to the Fermi wavelength or mean-free path can lead to new families of electronic devices. Electrical rectification can be realized in nanowires formed by nanoscale control of the metal-insulator transition at the interface between $LaAlO_3$ and $SrTiO_3$. Controlled in-plane asymmetry in the confinement potential produces electrical rectification in the nanowire, analogous to what occurs naturally for Schottky diodes or by design in structures with engineered structural inversion asymmetry. Nanostructures produced in this manner may be useful in developing a variety of nanoelectronic, electro-optic and spintronic devices.

The discovery of a high-mobility two-dimensional electron gas (2DEG) at the interface between $LaAlO_3$ and $SrTiO_3$ has opened exciting new opportunities for electric-field controlled phenomena and devices. The interface between thin films of LaAlO$_3$ and TiO$_2$-terminated SrTiO$_3$ exhibits an abrupt insulator-to-metal transition with increasing LaAlO$_3$ thickness. The 2DEG is n-type and strongly localized at the interface. Films grown at a critical thickness of 3 unit cells (3uc-LaAlO$_3$/SrTiO$_3$) exhibit a reversible and hysteretic interfacial metal-insulator phase transition that can be programmed by voltages V$_{bg}$~+/−100 V applied to the back SrTiO$_3$ substrate.

Figure 19:
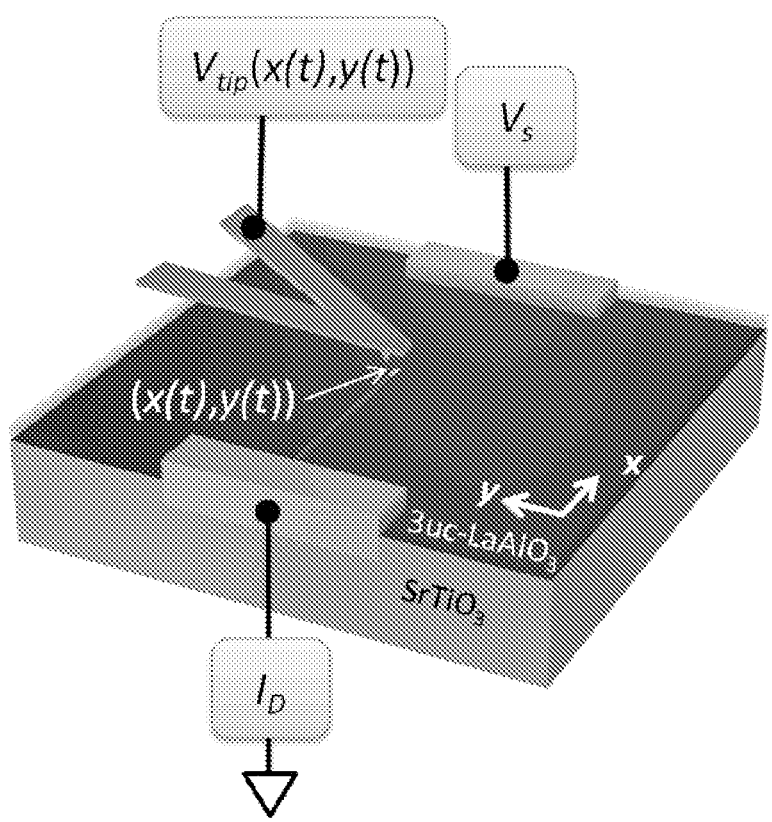
FIG. 19 is a schematic diagram illustrating the nanowriting process at the LaAlO$_3$/SrTiO$_3$ interface. Au electrodes (shown connected to $V_s$ and $I_D$) are electrically contacted to the LaAlO$_3$/SrTiO$_3$ interface. The AFM tip with an applied voltage is scanned once between the two electrodes with a voltage applied $V_{tip}(x(t), y(t))$. Positive voltages locally switch the interface to a conducting state, while negative voltages locally restore the insulating state. Here, a conducting nanowire is being written. The conductance between the two electrodes is monitored by applying a small voltage bias on one of the two gold electrodes ($V_s$) and reading the current at the second electrode ($I_D$).

Nanoscale control of the interfacial metal-insulator transition in 3 uc-LaAlO$_3$/SrTiO$_3$ can be achieved using a conducting AFM probe. A positive voltage applied to the AFM tip with respect to the interface locally switches the interface into a conducting state, while a negative voltage locally restores the interface to an insulating state. Conducting nanostructures are created by scanning the AFM tip over the 3uc-LaAlO$_3$/SrTiO$_3$ surface along a trajectory (x(t),y(t)) while a voltage V$_{tip}$(t) is applied (FIG. 19). Writing with a smaller V$_{tip}$ or faster scan rate generally produces a narrower, less highly conducting nanostructure. Nanostructures are stable for ~1 day in atmospheric conditions at room temperature, and indefinitely under modest vacuum. It is believed that the AFM writing procedure charges the top LaAlO$_3$ surface and modulation-dopes the interface with near-atomic spatial precision. Using this writing procedure, a variety of quasi-zero-dimensional and quasi-one-dimensional nanostructures has been created. Nanoscale tunnel junctions and transistors with features as small as 2 nm have also been demonstrated.

Asymmetries in the electronic confining profile generally lead to non-reciprocal behavior in transport (i.e. I(V)≠−I(−V)). Diodes formed by p-n junctions, modulation-doped heterostructures, and Schottky barriers are just a few examples of non-reciprocal devices that play an essential role in modern electronics. Non-reciprocal devices down to nanoscale dimensions have been created by various methods including metal-semiconductor and semimetal-semiconductor interfaces, controlled in-plane doping, complementary-doped nanotubes, and hybrid organic/inorganic semiconductors.

Nanoscale rectifying junctions can be formed along nanowires formed within 3uc-LaAlO$_3$/SrTiO$_3$ heterostructures. Thin films of LaAlO$_3$ are grown on TiO$_2$-terminated (001) SrTiO$_3$ substrates by pulsed laser deposition with in situ high pressure reflection high energy electron diffraction (RHEED). The films are grown at a substrate temperature of 550° C. under oxygen pressure of 10$^{-3}$ mbar and cooled down to room temperature at a 10$^{-3}$ mbar. After growth, electrical contacts to the interface are defined by optical lithography using a combination of ion milling and Au/Ti deposition. Within a 35×35 μm$^2$ "canvas" defined by the electrode edges, nanostructures are "written" and "erased" at the interface using conducting AFM lithography (FIG. 19). The nanoscale writing and subsequent transport experiments are performed at the room temperature (295 K) under atmospheric conditions (35-50% relative humidity). During and after the writing process, the transport properties of these nanostructures are monitored by applying a small voltage V$_s$=0.1 V to an electrode connected to one end of the nanowire. The resulting current is measured at a second electrode connected to the other end of the nanowire which is held at virtual ground (FIG. 19).

The series of three experiments described below demonstrates how the profile created by the AFM voltage can lead to linear or rectifying behavior. These experiments were performed on the same canvas, whereby a nanowire is first written, followed by transport experiments, followed by an erasure of the canvas (raster-scanning the entire area with V$_{tip}$=−10V) so that a new nanostructure can be created. Experiments were performed on multiple devices written onto two different 3uc-LaAlO$_3$/SrTiO$_3$ heterostructures grown under nominally identical conditions. For the purpose of comparison, the results shown here are for devices and structures written in a single experimental session.

In an initial experiment, a nanowire is created with a spatially uniform positive voltage V$_{tip}$=+10 V (FIG. 20a). The resulting surface charge is intentionally uniform (FIG. 20b) and produces a nanowire along the x-direction with highly linear current-voltage (I-V) characteristics (FIG. 20d). The lateral width of this nanowire is determined by "cutting" it: a negative bias V$_{tip}$=10 V is applied to the AFM tip as it moves across the wire (along the y-direction), and the conductance of the nanowire is monitored using a lock-in amplifier. Analysis of the conductance profile as the nanowire is cut yields a width w=2.6 nm.

The nanowire is subsequently erased and replaced by a structure created with an asymmetric sawtooth-shaped voltage pulse (FIG. 20e) described by:

$$V_{\pm}(x,y)/V_0 \equiv \begin{cases} \pm(2x-1)/x_d, & 0 > x < x_d \\ 1, & \text{otherwise,} \end{cases}$$

where V$_0$=+10 V and x$_d$=40 nm are the sawtooth amplitude, asymmetry direction and width, respectively. During the writing process, the AFM tip is scanned at a speed v$_x$=400 nm/s. After writing, the measured I-V curve (FIG. 20h) becomes highly non-reciprocal and rectifying, allowing substantial current flow only for positive bias. There is a small leakage current for the reverse bias, and an onset of reverse-field "breakdown" when V<−4.5 V.

The nanostructure is subsequently erased and a third one is written with an asymmetric voltage in the opposite direction, using parameters and x$_d$=40 nm (FIG. 20i). Again, the I-V curve shows rectifying behavior but with an opposite polarity (FIG. 20l). A comparison of the two diode structures (FIGS. 20h, 20l) shows a ~20% variation in the reverse breakdown voltage; these variations are typical of those seen experimentally for a given set of parameters.

Figure 20:
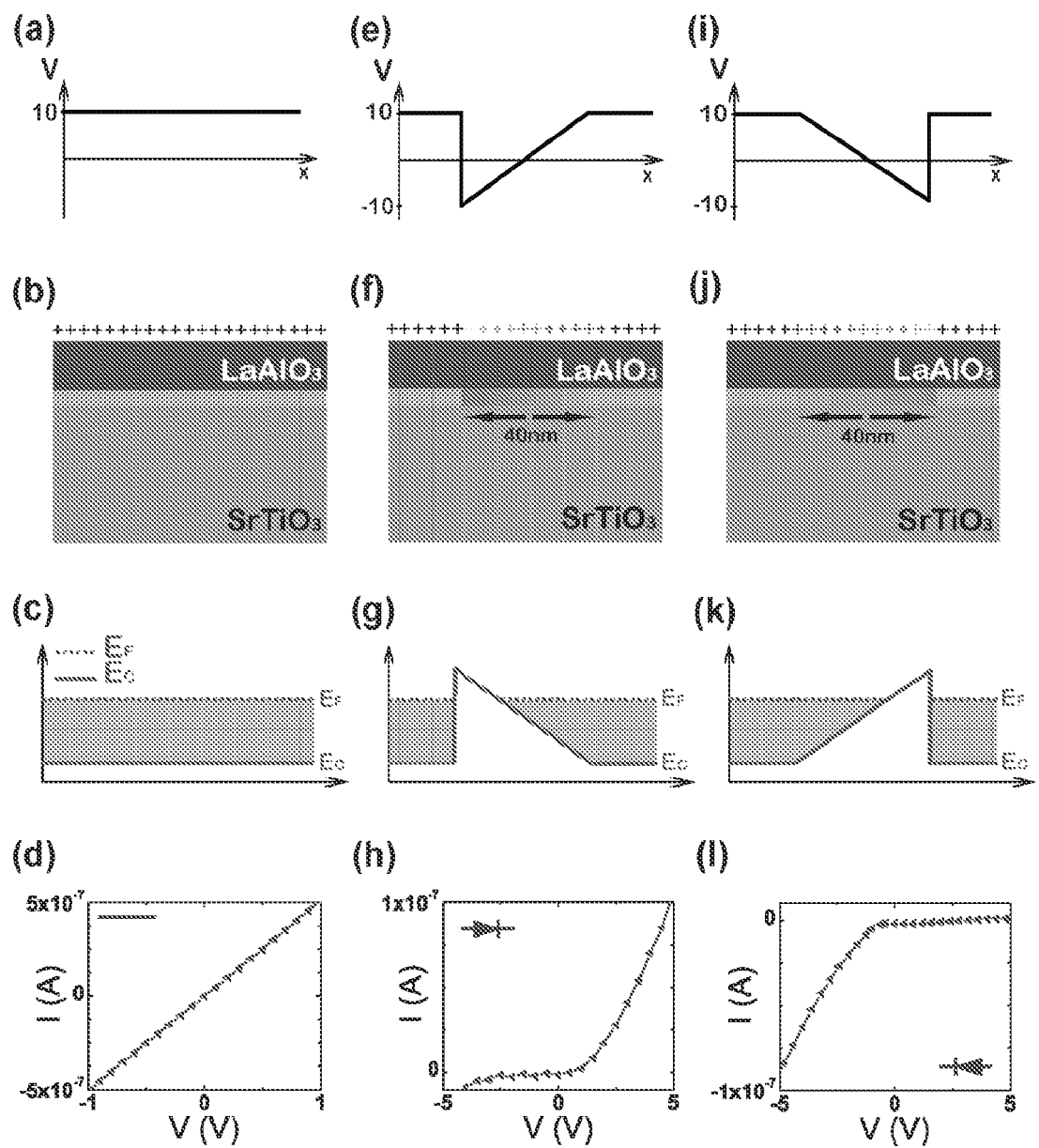
FIG. 20 illustrates structure and electrical properties of non-reciprocal nanoscale devices at the LaAlO$_3$/SrTiO$_3$ interface. (a) Tip voltage profile during writing procedure. (b) Cross-sectional view illustrating the surface modulation-doping of the LaAlO$_3$/SrTiO$_3$ interface, resulting in a spatially uniform nanowire. (c) Schematic energy-band diagram for the conduction band minimum $E_c$ and Fermi energy $E_F$ for the uniform nanowire. (d) Current-voltage (I-V) plot for the uniform nanowire. (e) Tip voltage profile $V_{tip}$, (f) cross-sectional view, (g) schematic energy-band diagram and (h) I-V characteristics for a positive sawtooth potential $V_{tip}(x,y)=V_0 V_+(x,y)$, where $V_0=10$ V. (i) Tip voltage profile $V_{tip}$, (j) cross-sectional view, (k) schematic energy-band diagram and (l) I-V characteristics for a negative sawtooth potential $V_{tip}(x,y)=V_0 V_-(x,y)$, where $V_0=10$ V.

Schematic energy diagrams for nanostructures written under uniform and non-uniform tip voltage profiles are presented in FIGS. 20c, 20g, 20k. The asymmetric conduction-band profile E$_c$(x) (FIGS. 20g, 20k) and I-V characteristics mimic that of a metal-semiconductor Schottky junction. Under forward bias (FIG. 20g), substantial current flow is observed above a threshold voltage V$_{th}$. This threshold voltage allows one to estimate the strength of the electrostatic field produced by the potential gradient E~V$_{th}$/x$_d$=2.5×10$^6$ V/cm. Under a reverse bias (FIG. 20k), current flow is suppressed by the sharp potential barrier. The rectifying properties of the nanostructures described above depend upon the modulation-doping profile along the nanowire. As demonstrated in FIG. 20, these profiles can be created by spatial modulation of the writing voltage V$_{tip}$. A second method can be demonstrated for producing non-reciprocal nanostructures. In this approach, spatial variations in the conduction-band profile are created by a precise sequence of erasure steps. In a first experiment, a conducting nanowire is created using V$_{tip}$=+10 V. The initial I-V curve (FIG. 21a, the substantially linear curve) is highly linear and reciprocal. This nanowire is then cut by scanning the AFM tip across the nanowire at a speed v$_y$=100 nm/s using V$_{tip}$=−2 mV at a fixed location (x=20 nm) along the length of the nanowire. This erasure process increases the conduction-band minimum E$_c$(x) locally by an amount that scales monotonically with the number of passes N$_{cut}$ (FIG. 21a inset); the resulting nanostructure exhibits transitions from conducting, to activated, and finally to tunneling behavior. The symmetry of the full I-V curve is noted. As $N_{cut}$ increases, the transport becomes increasingly nonlinear; however, the I-V curve remains highly reciprocal.

Figure 21:
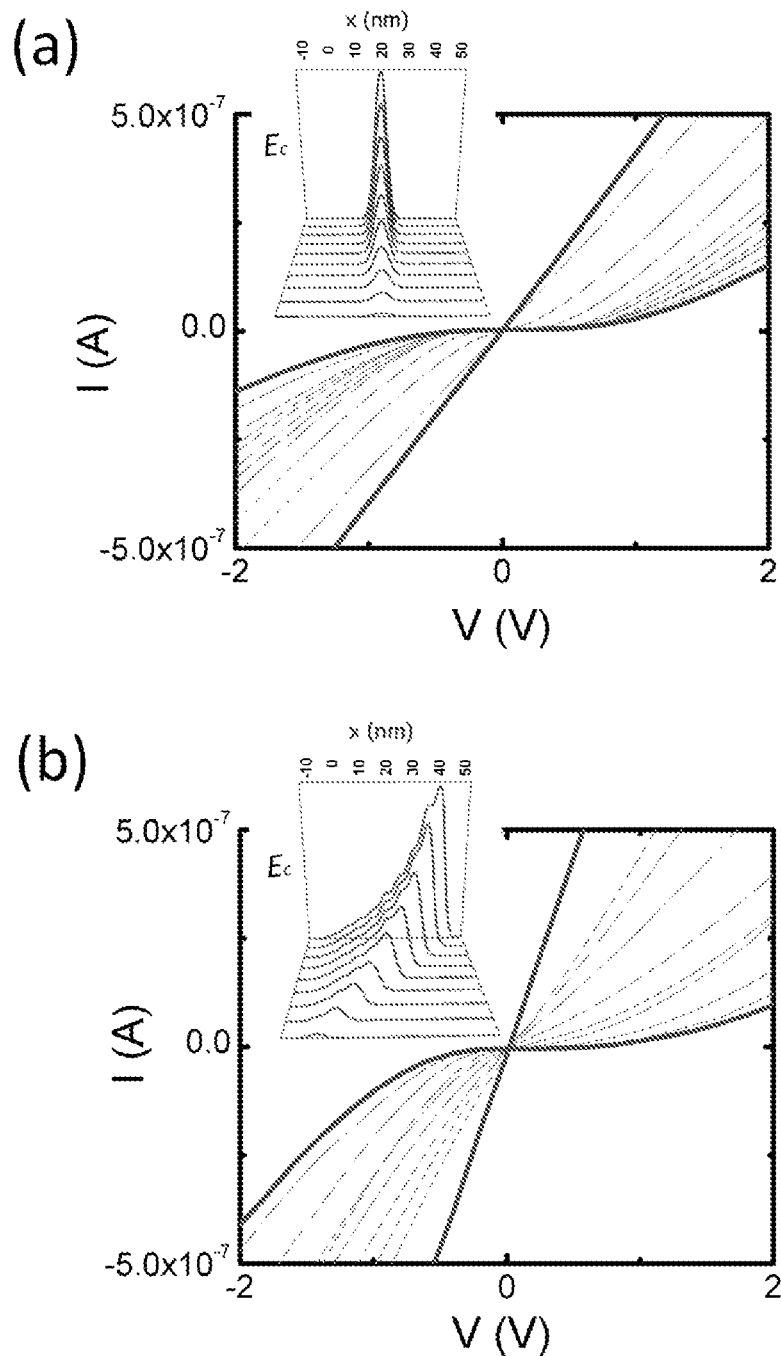
FIG. 21A are I-V plots for a nanowire cut at the same location multiple times with an AFM tip bias $V_{tip}=-2$ mV. The substantially linear curve indicates I-V curve before the first cut. Intermediate I-V curves are shown after every alternate cut. As the wire is cut, the potential barrier increases (inset), and the zero-bias conductance decreases; however, the overall I-V curve remains highly reciprocal.
FIG. 21B are I-V plots for a nanowire subject to a sequence of cuts $N_{cut}(x)$ at nine locations spaced 5 nm apart along the nanowire (see Table 3). The substantially linear curve indicates I-V curve before the first cut. The asymmetry in $N_{cut}(x)$ results in a non-reciprocal I-V curve.

The canvas is subsequently erased and a uniform conducting nanowire is written in a similar fashion as before ($V_{tip}$=+10V, $v_x$=400 nm/s). A similar erasure sequence is performed; however, instead of cutting the nanowire at a single x coordinate, a sequence of cuts is performed at nine adjacent x coordinates along the nanowire (separated by dx=5 nm). The number of cuts at each location along the nanowire $N_{cut}(x)$ increases monotonically with x, resulting in a conduction band profile $E_c(x)$ that is asymmetric by design (FIG. 21b, inset). The resulting I-V curve for the nanostructure evolves from being highly linear and reciprocal before writing (FIG. 21b, $N_{cut}$=0) to highly nonlinear and non-reciprocal (FIG. 21b, $N_{cut}$=38).

Nanoscale control over asymmetric potential profiles at the interface between $LaAlO_3$ and $SrTiO_3$ can have many potential applications in nanoelectronics and spintronics. Working as straightforward diodes, these junctions can be used to create half-wave and full-wave rectifiers for AC-DC conversion or for RF detection and conversion to DC. By cascading two or more such junctions, with a third gate for tuning the density in the intermediate regime could form the basis for low-leakage transistor devices. Generally speaking, the ability to control the potential V(x) along a nanowire can be used to create wires with built-in polarizations similar to those created in heterostructures that lack inversion symmetry. Nanoscale control over inversion symmetry breaking can be used to produce nonlinear optical frequency conversion (i.e., second-harmonic generation or difference frequency mixing), thus providing a means for the generation of local sources of light or THz radiation. A modification of this idea involves the creation of potential profile asymmetries that are in-plane and transverse to the nanowire direction (i.e., along the y direction in FIG. 19a). Such asymmetries could give rise to significant Rashba spin-orbit interactions. The resulting effective magnetic fields could allow control over spin precession along two orthogonal axes, and thus exert full three-dimensional control over electron spin in a nanowire.

Examples Related to Ultrasensitive Nanoscale Magnetic Field Sensor

An ultrasensitive nanoscale magnetic field sensor is provided that can have important applications such as determining the three-dimensional structure of biomolecules with atomic precision or reading out single spin qubits in a quantum computer.

The state of the art regarding sensitivity to magnetic fields with nanometer-scale spatial resolution is described in a recent paper by Mamin et al. Using a technique known as Magnetic Resonance Force Microscopy (MRFM), Mamin et al. imaged a multiwall carbon nanotube with 7 nm spatial resolution. The sensitivity was quoted as:

$$\mu_{min} \approx 1.4 \times 10^{-24} (J/T) Hz^{-1/2} \approx 100 \text{ spins } Hz^{-1/2}$$

The magnetic field sensitivity, using a distance z=50 nm, yields:

$$B_{min} \approx 2.3 \times 10^{-6} T Hz^{-1/2}$$

Other methods for measuring magnetic fields are Hall crosses and Superconducting Quantum Interference Devices (SQUIDs). The most sensitive Hall cross reported gives a sensitivity of $\Phi_{min} \approx 10^{-2} \phi_0$ where $\phi_0$=h/2e=2.067×10$^{15}$ Wb is the magnetic flux quantum. The corresponding magnetic field sensitivity is given by dividing by the Hall cross area (50 nm×50 nm): 3 Gauss.

Awschalom et al. performed sensitivity measurements of a low-noise microsusceptometer using nearly quantum limited dc SQUIDs. At T=290 mK they demonstrated a sensitivity of ~10$^{-5}\phi_0$Hz$^{-1/2}$≈100 spins Hz$^{-1/2}$ using pickup coils ~25 μm on a side.

In one embodiment, a nanoscale magnetic field sensor is provided that is sensitive to ~Gauss Hz$^{-1/2}$ magnetic fields with a sensitivity determined by the Hall cross area (6 nm×6 nm). It is approximately as sensitive as the SQUIDs but with a spatial resolution more than 1000× better (in linear terms). It has an active area that is 100× smaller than the smallest Hall cross ever reported. And it displays a sensitivity of ~1 spin Hz$^{-1/2}$, which is about 100× better than MRFM.

The utility of combined high spatial resolution and magnetic field sensitivity is generally known. MRFM promises three-dimensional imaging of proteins and other biological molecules, thus extending the utility of magnetic resonance techniques down to the atomic scale. Key to the MRFM technique is an ultrasensitive magnetic field sensor, based on using a nanomechanical cantilever that is sensed optically (or otherwise).

The approach of the embodiment disclosed herein is different from conventional sensors, and is based on the ability to structure at the nanoscale the metal-insulator transition in an interfacial oxide heterostructure.

Figure 14:
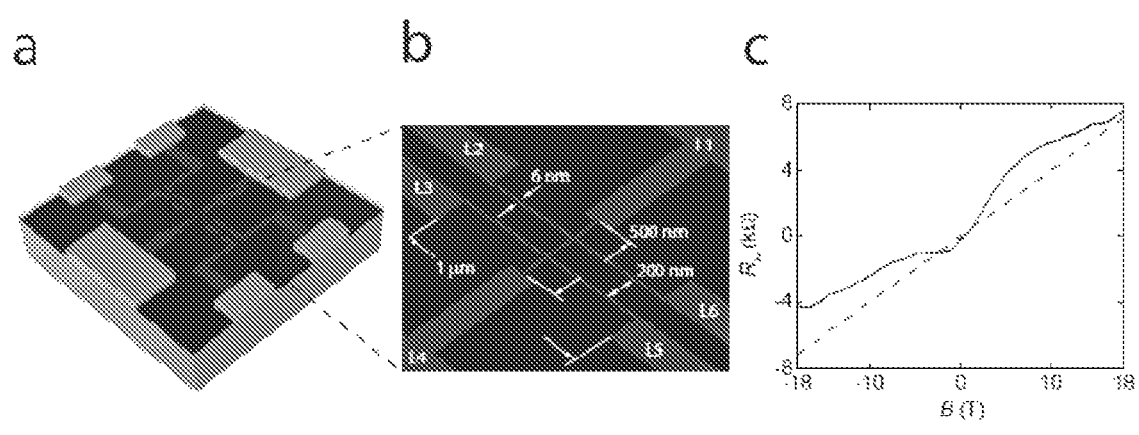
FIG. 14A is a perspective view of the overall geometry of the Hall cross used as a Hall sensor.
FIG. 14B is a close-up view of the Hall sensor.
FIG. 14C illustrate the Hall voltage measured as a function of applied magnetic field.

FIG. 14a illustrates the basic device, showing the $LaAlO_3$/$SrTiO_3$ heterostructure with gold electrical contacts to the interface. The shaded areas represent regions that have been switched to the conducting phase. FIG. 14(b) shows a close-up schematic of the device that was "written." The Hall device comprises a channel (between leads L1 and L4) with two pairs of Hall leads (L2 and L6, L3 and L5). Hall measurements were performed on the junction comprising leads L1, L3, L4 and L5 (FIG. 14(c)). The unusual shape is attributed generally to properties associated with the quantum and nanoscale nature of the device. Normally, the Hall effect is linear with magnetic field. However, distinct plateaus are observed at high magnetic field, and are associated with the Quantum Hall Effect. However, the device operation is associated with the response near zero magnetic field. It is not the ordinary Hall effect. The physical origin may be due to the spin Hall effect, a manifestation of large spin-orbit coupling in this system.

FIG. 15(a) shows a close-up of the direct Hall voltage measured as a function of magnetic field. A sharp Lorentzian "spike" is observed with a full-width at half maximum of ~2 mTesla. The signal-to-noise ratio allows one to use the slope of this curve to achieve ~1 Gauss Hz$^{-1/2}$ without any further optimization. In terms of flux sensitivity, that corresponds to $\phi_{min}$=3×10$^{-6}\phi_0$ Hz$^{-1/2}$. This should be enough for single-spin imaging with ~6 nm spatial resolution.

The mechanism that gives rise to the unusually high sensitivity is related to the ultrasmall size of the Hall cross and possibly other effects related to the strong spin-orbit coupling of electrons in the two-dimensional electron gas system.

This device can be used for sensitive magnetic imaging. It can be placed on a silicon cantilever and integrated with a scanning probe microscope, or held fixed while a sample is scanned over it. It can be integrated with electron or nuclear spin resonance as a supersensitive local magnetic pick-up, with the potential to image molecules in three dimensions with atomic precision.

Example Related to a Rewritable Nanoscale Oxide Photodetector

Nanoscale devices with photonic properties have been the subject of intense research for the past decade. Potential nanophotonic applications include telecommunications, polarizationsensitive detectors, and solar power generation. Although much progress has been made in the placement of nanowires and integration of electronic and optical nanowire components on a single chip, the scaling of single nanowire devices to macroscopic circuit sizes remains a major obstacle. Rewritable nanoscale photodetectors can be created at the interface between $LaAlO_3$ and $SrTiO_3$. Nanowire junctions with characteristic dimensions of 2-3 nm are created using a reversible conductive atomic force microscope writing technique. These nanoscale devices exhibit remarkably high gain for their size, in part because of the large electric fields produced in the gap region. The photoconductive response is electric field-tunable and spans the visible-to-near-infrared regime. The ability to integrate rewritable nanoscale photodetectors with nanowires and transistors in a single material platform enables new families of integrated optoelectronic devices and applications.

An AFM tip can be used to write, erase, and rewrite nanoscale devices such as wires, diodes, and transistors into the interface between $LaAlO_3$ and $SrTiO_3$. In one embodiment described below, a rewritable nanoscale oxide photodetector is provided, and the photosensitivity of the device is demonstrated. By writing a wire with a gap a nanoscale photodetector can be positioned with nanometer accuracy. The detectors are sensitive to light with wavelengths between 532 nm to 1340 nm.

The conductivity of the interface between $LaAlO_3$ and $SrTiO_3$ is tunable with $LaAlO_3$ thickness or by the application of an electric field. A superconducting transition can be observed and can also be tuned with an applied electric field. In a sample with appropriate $LaAlO_3$ thickness, an AFM probe can be used to write a nanoscale wire into the interface. The writing of dots and wires smaller than 5 nm, diodes, and transistors have all been demonstrated. These devices are expected to have applications in relation to reprogrammable transistors and high-density data storage, inter alia.

The nanostructures were characterized optically by measuring photo-induced current (photocurrent). The intensity of a laser source was modulated by an optical chopper (300 Hz<$f_R$<1,700 Hz, 50% duty cycle). A voltage bias was applied to a 'source' electrode ($V_{SD}$). After the light was directed to the sample, the resulting photocurrent, $i_{PC}$, was collected from a drain electrode and measured with a lock-in amplifier at $f_R$. A background persistent photoconductive effect was observed under continuous illumination; however, the dependence of this persistent effect on the illumination history is uncorrelated with the a.c. response, and is subtracted automatically using the lock-in technique. The laser light illuminating the sample was either focused with one of two refracting microscope objectives (numerical aperture, NA=0.13: diffraction-limited spot size $d_L$≈3 mm; or NA=0.73: $d_L$≈0.5 mm), a reflecting microscope objective (NA=0.28: 5 $d_L$≈0.7 mm), or in some cases the light was left unfocused ($d_L$≈5 mm). Fluence is therefore expressed in terms of laser intensity, which is the time-averaged laser power divided by the illuminated area. Even with high light intensities, heating is expected to be minimal because of the transparency of the material. Fixed-position photoconductivity measurements were performed by fixing the position of the laser beam at the site of the photodetector. The photoconductive properties of these nanodevices were mapped spatially using SPCM. The microscope objective was mounted on a closed-loop, three-axis piezo scanner and raster-scanned relative to the sample surface. The resulting photocurrent was measured as a function of laser position. Simultaneously, the reflected light could be collected as a function of position to create a reflectance image. To maximize nanostructure lifetimes measurements were performed in a vacuum of less than 1 mbar. To reduce the signal from thermally activated carriers, some experiments were performed in a continuous-flow cryostat at T=80 K.

Figure 22:
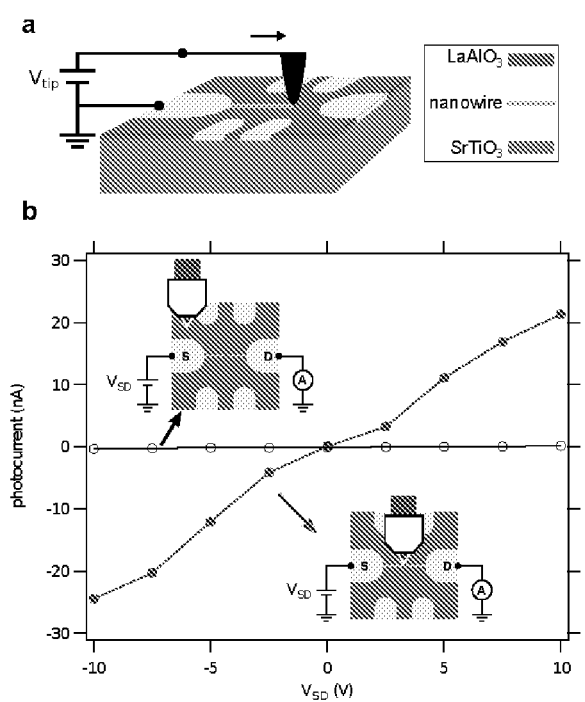
FIG. 22 includes a diagram of a sample and a photoresponse. (a) A schematic illustration of how a c-AFM tip writes a nanowire at the interface between LaAlO$_3$ and SrTiO$_3$. (b) Photocurrent collected from a drain electrode (D) versus source bias ($V_{SD}$ applied to a source electrode (S)) when the laser is focused on the photodetector (closed symbols) and 25 mm away (open symbols). Data points are derived from a Gaussian fit to an SPCM image (Wavelength, 633 nm; laser intensity, I≈20 W cm$^{-2}$ (numerical aperture, NA=0.73); temperature, T=80 K.).

Wires with 2.5 nm width are drawn between the electrodes using a conducting AFM in contact mode. A positive bias on the tip creates a wire and a negative bias will erase the wire. Writing is done in atmosphere at room temperature and the AFM is kept in a dark environment to suppress photo-doping of the $SrTiO_3$ substrate ($E_g$=3.2 eV). The conductivity of the 2DEG is monitored with a picoammeter while writing: when the wire is connected to both electrodes a sudden rise in conductance is observed. Similarly, the conductance is monitored while cutting a wire. The distance over which the conductance drops is an indication of the wire width. Writing and erasing of nanowires is reproducible for a given tip bias. Electronic nanostructures can be created with a high degree of precision and, furthermore, are relocatable and reconfigurable. The results presented here are based on experiments performed on $LaAlO_3/SrTiO_3$ samples produced during two separate growth sessions. The optical properties of the nanostructures were characterized by fixed-position photocurrent and scanning photocurrent microscopy (SPCM). When the light overlaps with the device a sharp increase in the photocurrent is observed (FIG. 22b). Photocurrent measurements have been performed as long as nine days following c-AFM lithography.

Figure 23:
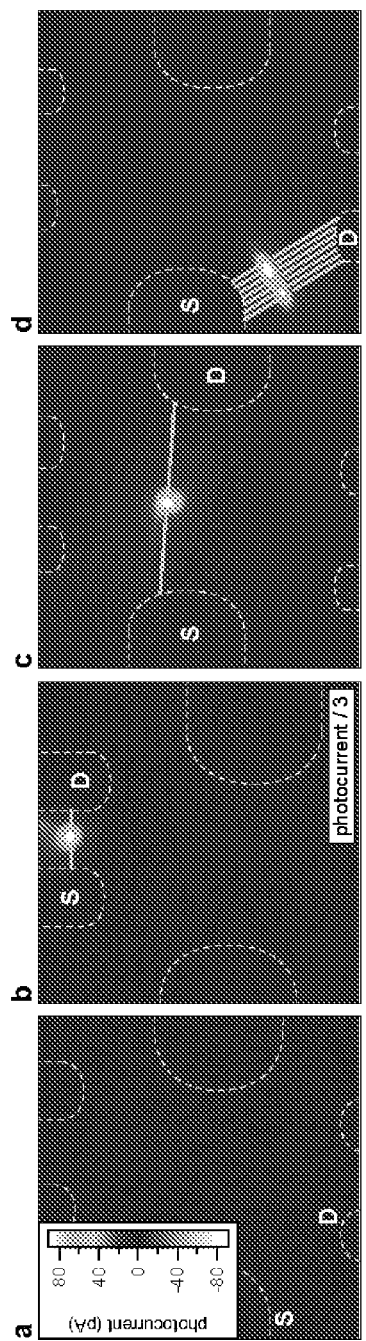
FIG. 23 shows scanning photocurrent microscopy (SPCM) images of various nanostructures written at the LaAlO$_3$/SrTiO$_3$ interface. Images are 50×50 mm$^2$. Dashed lines indicate boundaries of areas where electrical contact is made to the LaAlO$_3$/SrTiO$_3$ interface; solid lines indicate the locations of nanowires. (a) SPCM image of area before any nanostructures are written. (b) SPCM image for a nanowire junction written close to a pair of electrodes. (c) SPCM image formed after erasing the previous nanowire and writing a second nanowire junction from the electrodes. (d) SPCM image for a set of seven parallel wires with adjacent junctions of width $w_j$=2.5 nm; the separation between wires is $w_s$=2 mm. (a,b, I≈20 kW cm$^{-2}$, $V_{SD}$=0.5 V; c,d, I≈30 kW cm$^2$, $V_{SD}$=0.1 V. All panels: NA=0.73, T=300 K.)

The photosensitivity of the devices written at the $LaAlO_3/SrTiO_3$ interface is spatially localized near the gap regions. An SPCM image of the photocurrent between two electrodes that do not have a device written between them shows a spatially diffuse photocurrent of less than 2 pA (FIG. 23a). A simple nanophotonic device comprises a nanowire with a narrow gap or junction. This device was created by first writing the wire with a c-AFMtip bias of $V_{tip}$=+10 V, producing a nanowire with a width of $w_w$~2.5 nm. The junction was created by crossing the wire with $V_{tip}$=−10 V, producing a gap with comparable width $w_j$~2.5 nm. The nanowire junctions could be deterministically placed with nanometer-scale accuracy. The SPCM image shows a localized photocurrent (wavelength=633 nm; temperature, T=300 K) in the region of the junction (FIG. 23b). The devices are erasable and reconfigurable. Furthermore, they are not damaged by illumination with I≈kWcm$^{-2}$ intensity. After performing SPCM measurements on the device shown in FIG. 23b, the device was erased and a new device created farther from the electrodes (FIG. 23c). The photosensitivity of these devices could be optically modulated at frequencies as high as 3.5 kHz, and the response appeared to be limited by the RC time constant of the device.

More complex devices are readily created. For example, a nanowire junction array (FIG. 23d) consisting of seven parallel wires spaced 2 mm apart was drawn between the source and drain electrodes. The nanowires were subsequently cut in a single stroke using a tip bias of $V_{tip}$=−10 V, creating neighbouring junctions of width $w_j$~2.5 nm. The resulting photocurrent image shows the expected stripe shape, demonstrating that the photocurrent signal originates from all of the gaps. Even though the diffraction-limited spot size ($d_L$≈0.5 mm) is smaller than the line spacing, the individual junctions are not separately distinguishable. The photocurrent at the interior junction is suppressed compared to the outermost junctions. This result indicates how carrier diffusion away from the junctions can also contribute significantly to the overall photocurrent response. The extent of the photoconductive spatial sensitivity appears to be of the order of the spacing in this case ($w_s \approx 2$ mm), although inhomogeneities in the response of the junctions cannot be ruled out as a contributing factor.

Figure 24:
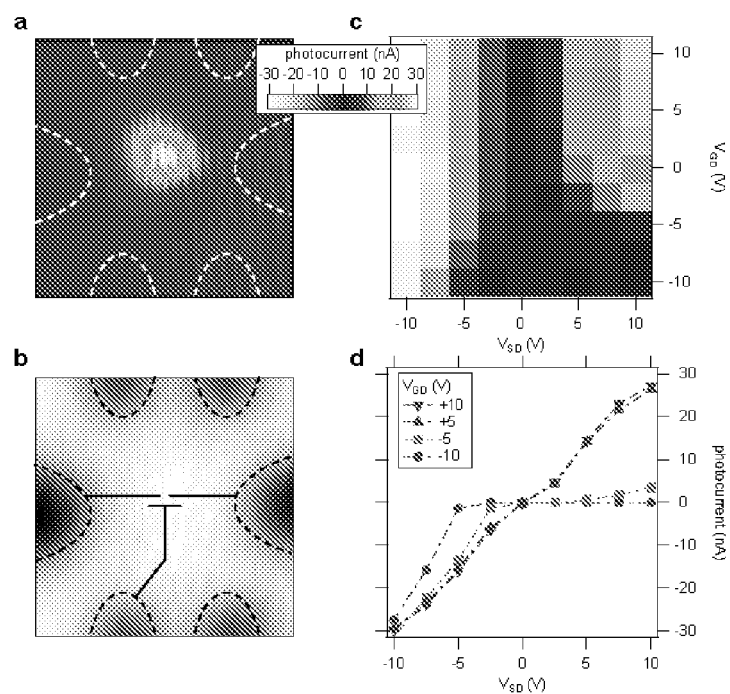
FIG. 24 illustrates a three-terminal, nanoscale, locally gateable photodetector. (a) SPCM image at source and gate biases ($V_{SD}$ and $V_{GD}$, respectively) of +10 V. (b) Simultaneously acquired reflectivity image. Dashed lines show outlines of electrodes. Solid lines represent nanostructures written with a c-AFM. Both the nanowire widths and gap separations are exaggerated for clarity. Scan size is 50×50 mm$^2$. (c) Photocurrent as a function of $V_{SD}$ and $V_{GD}$. d, Photocurrent as a function of $V_{SD}$ plotted for different values of $V_{GD}$. (I≈20 W cm$^{-2}$ (NA=0.13), T=80 K.)

The functionality of these devices can be extended by adding an independent gate electrode. A geometry previously investigated as a nanoscale transistor, a SketchFET, can be adopted. The gate electrode is written perpendicular to the existing source-drain nanowire. A gate bias $V_{GD}$ can be used to modify the source-drain conductance, enabling conduction between source and drain for positive $V_{GD}$ and inhibiting it for negative $V_{GD}$. As for the case of the two-terminal wire with junction, photocurrent that is spatially localized near the junction is observed where the device was written (FIG. 24a). A simultaneously acquired laser reflectivity image (FIG. 24b) does not show any observed signature of the nanophotonic detector, such as changes in the absorption or scattering, which is also the case for two-terminal devices. SPCM images were acquired for an array of source and gate biases, $-5 \text{ V} \leq V_{SD}, V_{GD} \leq +5$ V. To quantify the amplitude of the photocurrent response, a two-dimensional Gaussian fit to the SPCM images was performed. The amplitude of the Gaussian fit (photocurrent amplitude) measured as a function of $V_{SD}$ and $V_{GD}$ (FIG. 24c) exhibits a polarity that is always the same sign as $V_{SD}$, irrespective of $V_{GD}$, indicating that there is negligible leakage current from the gate to the drain. Furthermore, the photocurrent amplitude is suppressed when $V_{SD}$ is positive while $V_{GD}$ is negative, demonstrating the ability of the gate electrode to tune the photoconductivity in the source-drain channel.

Figure 25:
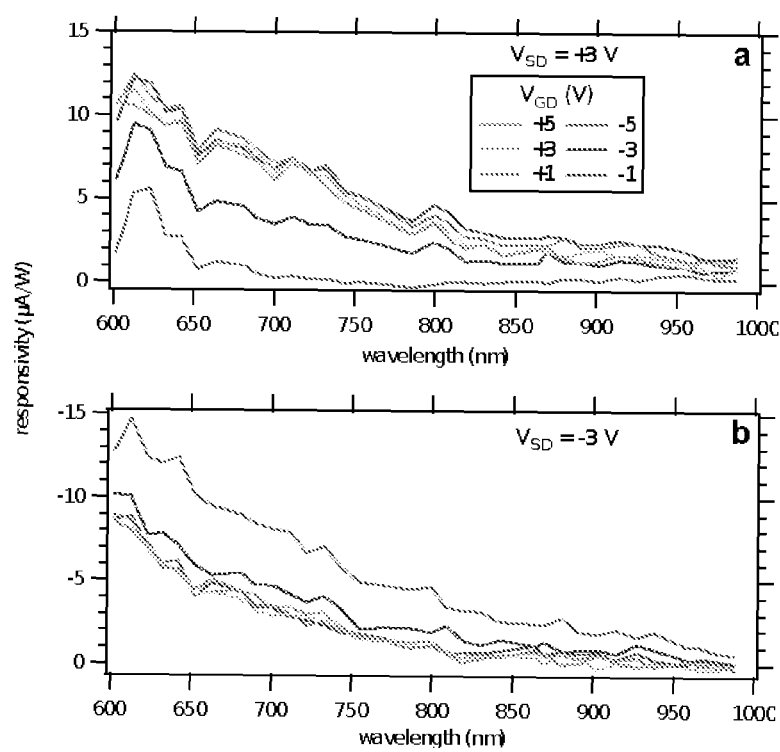
FIG. 25 illustrates gate-controlled spectral response of a photodetector. Fixed position photocurrent as a function of wavelength and $V_{GD}$ for (a) $V_{SD}$=+3 V (a) and (b) $V_{SD}$=−3 V (b). (NA=0.28, T=300 K.)
Figure 26:
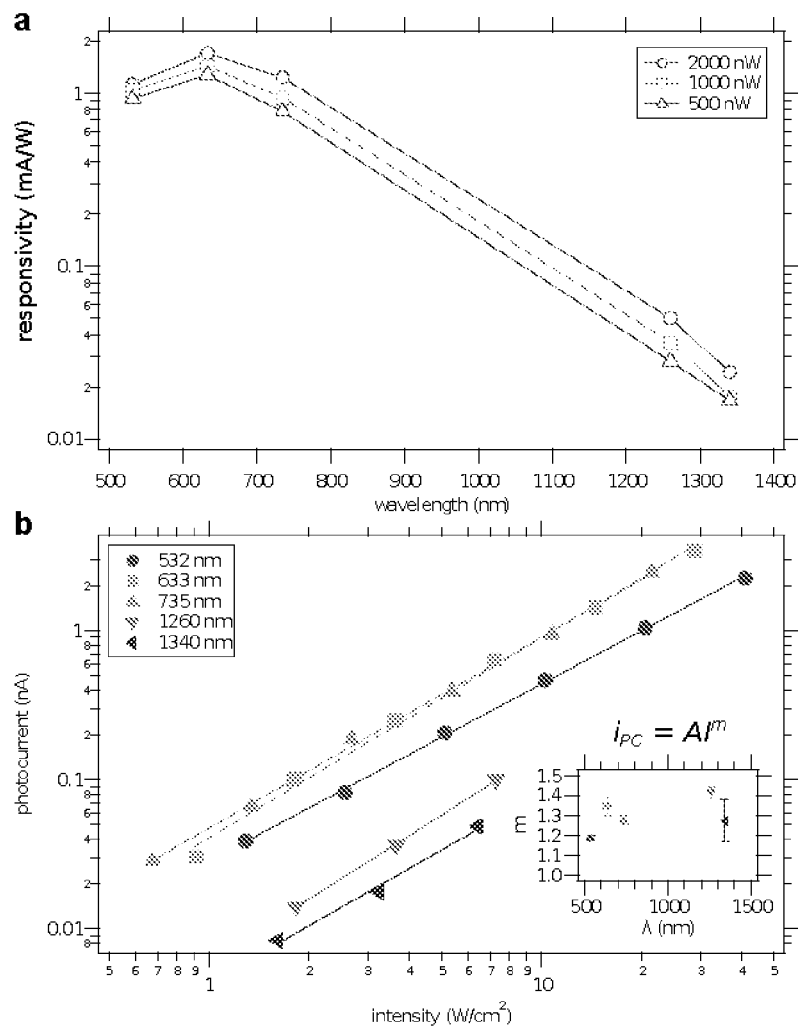
FIG. 26 shows spectral sensitivity and intensity dependence from visible to near-infrared wavelengths. (a) Responsivity of the photodetector from 532 nm to 1,340 nm. Symbols are derived from Gaussian fits of SPCM images; lines are guides to the eye. (b) Photocurrent versus optical intensity for different laser wavelengths. Lines are power-law fits. The inset shows the power-law exponent m as a function of wavelength. Error bars represent one standard deviation from the best fit value. ($V_{SD}$=2 V, $V_{GD}$=0 V, NA=0.13, T=80 K.)

To investigate the wavelength dependence of these devices, a pulsed, mode-locked Ti:sapphire laser was focused into a photonic-crystal fiber to provide tunable laser illumination over the continuous wavelength range 600-1,000 nm. As the white light source power varies with wavelength, the normalized responsivity of the device ($i_{PC}/P$, where $i_{PC}$ is the photocurrent and P is the laser power) is shown over this wavelength range (FIG. 25). A reflecting objective was used to maintain a constant illumination area versus wavelength. Data points in the vicinity of the pulsed laser source (780 nm) are not shown because of the high peak power and nonlinear effects in the sample (FIG. 26). A Stark-shifted spectral response is observed with changing $V_{GD}$. At positive $V_{SD}$, the photodetector response redshifts as the gate bias is increased. A similar Stark shift is observed when sweeping the source bias. The tuning of the responsivity is enhanced for positive $V_{SD}$, which is consistent with the behavior demonstrated in FIG. 24}. This evidence of a Stark effect, together with finite-element analysis showing that the electric field is predominantly confined to the gap region, indicates that the photo-induced absorption is highly localized. Measurements taken as a function of temperature show a slight redshift with increasing temperature.

In addition to the supercontinuum white light source, the optical response was measured at a number of fixed wavelengths ranging from the visible to near-infrared: 532 nm, 633 nm, 735 nm, 1,260 nm and 1,340 nm. The response at these wavelengths is consistent with the supercontinuum measurement in the range 600-1,000 nm (FIG. 26a). Remarkably, the photosensitivity extends to 1,340 nm, the longest wavelength investigated. A three-terminal device has similar tuning behaviour from $V_{SD}$ and $V_{GD}$ at 1,340 nm and at visible wavelengths. The intensity dependence of the photocurrent exhibits power-law behavior (FIG. {26b), $i_{PC} \sim A I^m$, where A is a proportionality constant, I is the laser intensity, and $m \approx 1.2-1.4$. The super-linear scaling with laser intensity is similar to other systems that are near a metal-insulator transition. Analysis of the noise equivalent target (NET) shows a minimum NET of 11 mW cm$^{-2}$ Hz$^{-1/2}$ (T=80 K and wavelength 735 nm).

Thus shown is the creation of a rewritable nanoscale photodetector. Pursuant to the embodiment, one can place the detector with nanometer accuracy by means of pre-patterned electrodes, created using standard photolithography techniques. Example detectors exhibit photosensitivity to at least 1.34 µm, the limit of our measurement capability. These devices will find widespread application in the integration of nanophotonic and nanoscale devices for macroscopic device preparation and bring new functionality to oxide nanoelectronics. For example, existing nanowire-based molecular sensors rely on the ability to bring the analyte into contact with the sensing area of the detector. Here the roles are reversed: a nanoscale photodetector can be placed in intimate contact with an existing molecule or biological agent. It may be possible to take advantage of the significant Stark-shifted photoresponse to improve the spatial sensitivity well beyond the diffraction limit. The ability to integrate optical and electrical components such as nanowires and transistors may lead to devices that combine, in a single platform, subwavelength optical detection with higher-level electronics-based information processing.

The foregoing description of the various embodiments has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

CITED PUBLICATIONS

All publications are incorporated by reference in their entirety.

X. Duan, Y. Huang, Y. Cui, J. Wang, and C. M. Lieber, Nature 409, 66 (2001), ISSN 0028-0836.

J. Wang, M. S. Gudiksen, X. Duan, Y. Cui, and C. M. Lieber, Science 293, 1455 (2001).

Y. Huang, X. Duan, and C. Lieber, Small 1, 142 (2005).

D. J. Sirbuly, M. Law, H. Yan, and P. Yang, J. Phys. Chem. B 109, 15190 (2005).

R. Agarwal and C. Lieber, Appl. Phys. A: Mater. 85, 209 (2006).

O. Hayden, R. Agarwal, and C. M. Lieber, Nature Mater. 5, 352 (2006), ISSN 1476-1122.

M. Freitag, J. C. Tsang, J. Kirtley, A. Carlsen, J. Chen, A. Troeman, H. Hilgenkamp, and P. Avouris, Nano Lett. 6, 1425 (2006).

Y. H. Ahn and J. Park, App. Phys. Lett. 91, 162102 (2007).

B. Tian, X. Zheng, T. J. Kempa, Y. Fang, N. Yu, G. Yu, J. Huang, and C. M. Lieber, Nature 449, 885 (2007).

L. Jiao, X. Xian, Z. Wu, J. Zhang, and Z. Liu, Nano Lett. 9, 205 (2009).

Z. Fan, J. C. Ho, Z. A. Jacobson, H. Razavi, and A. Javey, P. Nat. Acad. Sci. USA 105, 11066 (2008).

C. Cen, S. Thiel, G. Hammerl, C. W. Schneider, K. E. Andersen, C. S. Hellberg, J. Mannhart, and J. Levy, Nature Mater. 7, 298 (2008), ISSN 1476-1122.

C. Cen, S. Thiel, J. Mannhart, and J. Levy, Science 323, 1026 (2009).

A. Ohtomo and H. Y. Hwang, Nature 427, 423 (2004), ISSN 0028-0836.
C. W. Schneider, S. Thiel, G. Hammerl, C. Richter, and J. Mannhart, App. Phys. Lett. 89, 122101 (2006).
S. Thiel, G. Hammerl, A. Schmehl, C. W. Schneider, and J. Mannhart, Science 313, 1942 (2006).
N. Reyren, S. Thiel, A. D. Caviglia, L. F. Kourkoutis, G. Hammerl, C. Richter, C. W. Schneider, T. Kopp, A. Ruetschi, D. Jaccard, et al., Science 317, 1196 (2007).
A. D. Caviglia, S. Gariglio, N. Reyren, D. Jaccard, T. Schneider, M. Gabay, S. Thiel, G. Hammerl, J. Mannhart, and J. Triscone, Nature 456, 624 (2008), ISSN 0028-0836.
D. F. Bogorin, C. Cen, C. B. Eom, and J. Levy (unpublished).
K. van Benthem, C. Elsasser, and R. H. French, J. App. Phys. 90, 6156 (2001).
T. Feng, Phys. Rev. B 25, 627 (1982).
H. Katsu, H. Tanaka, and T. Kawai, Jpn. J. Appl. Phys. 39, 2657 (2000), ISSN 0021-4922.
E. Yagi, R. R. Hasiguti, and M. Aono, Phys. Rev. B 54, 7945 (1996).
A. Yamakata, T. aki Ishibashi, and H. Onishi, J. Mol. Catal. A: Chem. 199, 85 (2003), ISSN1381-1169.
T. Minato, Y. Sainoo, Y. Kim, H. S. Kato, K. ichi Aika, M. Kawai, J. Zhao, H. Petek, T. Huang, W. He, et al., J. Chem. Phys. 130, 124502 (2009).
D. A. Panayotov and J. T. Y. Jr., Chem. Phys. Lett. 436, 204 (2007), ISSN 0009-2614.
K. Shibuya, T. Ohnishi, T. Sato, and M. Lippmaa, J. App. Phys. 102, 083713 (2007).
H. J. Mamin, T. H. Oosterkamp, M. Poggio, C. L. Degen, C. T. Rettner, D. Rugar, "Isotope-Selective Detection and Imaging of Organic Nanolayers," Nano Letters 9, 3020 (2009).
A. Candini, G. C. Gazzadi, A. d. Bona, M. Affronte, D. Ercolani, G. Biasiol, L. Sorba, "Hall nano-probes fabricated by focused ion beam," Nanotechnology, 2105 (2006).
D. D. Awschalom, J. R. Rozen, M. B. Ketchen, W. J. Gallagher, A. W. Kleinsasser, R. L. Sandstrom, B. Bumble, "Low-noise modular microsusceptometer using nearly quantum limited dc SQUIDs," Applied Physics Letters 53, 2108 (1988).
J. E. Hirsch, "Spin Hall Effect," Physical Review Letters 83, 1834 (1999).
G. M. Whitesides, J. P. Mathias, C. T. Seto, Science 254, 1312 (1991).
M. A. Reed, C. Zhou, C. J. Muller, T. P. Burgin, J. M. Tour, Science 278, 252 (1997).
R. P. Andres et al., Science 273, 1690 (1996).
D. Leonard, M. Krishnamurthy, C. M. Reaves, S. P. Denbaars, P. M. Petroff, Applied Physics Letters 63, 3203 (1993).
P. G. Collins, A. Zettl, H. Bando, A. Thess, R. E. Smalley, Science 278, 100 (1997).
A. Bachtold, P. Hadley, T. Nakanishi, C. Dekker, Science 294, 1317 (2001).
X. F. Duan, Y. Huang, Y. Cui, J. F. Wang, C. M. Lieber, Nature 409, 66 (2001).
D. L. Klein, R. Roth, A. K. L. Lim, A. P. Alivisatos, P. L. McEuen, Nature 389, 699 (1997).
E. S. Snow, P. M. Campbell, Applied Physics Letters 64, 1932 (1994).
S. Y. Chou, P. R. Krauss, P. J. Renstrom, Journal of Vacuum Science & Technology B 14, 4129 (1996).
R. D. Piner, J. Zhu, F. Xu, S. H. Hong, C. A. Mirkin, Science 283, 661 (1999).
A. J. Heinrich, C. P. Lutz, J. A. Gupta, D. M. Eigler, Science 298, 1381 (2002).
A. R. Dingle, A. H. L. Stormer, A. A. C. Gossard, A. W. Wiegmann, Appl. Phys. Lett. 33, 665 (1978).
D. C. Tsui, H. L. Stormer, A. C. Gossard, Physical Review Letters 48, 1559 (1982).
A. Ohtomo, D. A. Muller, J. L. Grazul, H. Y. Hwang, Nature 419, 378 (2002).
A. Ohtomo, H. Y. Hwang, Nature 427, 423 (2004).
A. Ohtomo, H. Y. Hwang, Nature 441, 120 (2006).
S. Thiel, G. Hammerl, A. Schmehl, C. W. Schneider, J. Mannhart, Science 313, 1942 (2006).
M. Huijben et al., Nature Materials 5, 556 (2006).
A. Kalabukhov et al., Physical Review B 75, 1404 (2007).
C. W. Schneider, S. Thiel, G. Hammerl, C. Richter, J. Mannhart, Applied Physics Letters 89, 2101 (2006).
N. Reyren et al., Science 317, 1196 (2007).
C. Cen et al., Nature Materials 7, 298 (2008).
M. Basletic et al., Nature Materials 7, 621 (2008).
W. Siemons et al., Physical Review Letters 98, 6802 (2007).
J. M. Albina, M. Mrovec, B. Meyer, C. Elsasser, Physical Review B 76, 5103 (2007).

TABLE 1

| LaAlO$_3$ layer thickness | 0 uc | 2 uc | 3 uc | 4 uc |
|---|---|---|---|---|
| Photosensitive? | No | No | Yes | Yes |
| Background conductance | <10 nS | <10 nS | <10 nS | >1 μS |
| Write isolated structure? | No | No | Yes | Yes* |
| Write connected structure? | Not possible without producing damage | Not possible without producing damage | Possible for $V_{tip} > 3$ V | Possible for $V_{tip} > 7$ V |
| Topography change after writing | Yes | Yes | No | No |
| Cut with $V_{tip} = -10$ V | NA | NA | Yes | Yes*, after several attempts |

* For the 4 uc sample, writing and cutting procedures only modulate the conductivity. The interface is always conducting.

TABLE 2

SketchFET parameters $i_{noise}$, $i_d$, f, $f_T$, and $f_C$ at $(V_{SD}; V_{GD}) = (0 V, 0 V), (0 V, 5 V),$ and $(1 V, 5 V)$.

| $V_{SD}$ (V) | $V_{GD}$ (V) | $i_{noise}$ (pA) | $i_{df}$ (pA) | $f_T$ (MHz) | $f_c$ (MHz) |
|---|---|---|---|---|---|
| 0 | 0 | 41 | 380 | 1.7 | 5.1 |
| 0 | 5 | 41 | 680 | 2.4 | 9.6 |
| 1 | 5 | 41 | 6900 | 124 | 1600 |

TABLE 3

Number of cuts $N_{cut}(x)$ versus location x, resulting in non-reciprocal I-V profile in FIG. 3(b).

| $N_{cut}(x)$ | 1 | 3 | 5 | 7 | 11 | 15 | 21 | 31 | 38 |
|---|---|---|---|---|---|---|---|---|---|
| Position x (nm) | 0 | 5 | 10 | 15 | 20 | 25 | 30 | 35 | 40 |

What is claimed is:
1. A reconfigurable device comprising:
a first insulating layer;
a second insulating layer; and
a nanoscale quasi one- or zero-dimensional electron gas region disposed at an interface between the first and second insulating layers, wherein the device
(A) is reconfigurable by applying an external electrical field to the electron gas to change the conductivity of the electron gas region and
(B) has a structure with characteristics selected from the group consisting of the following:
(i) said device further comprises at least one other nanoscale quasi one- or zero-dimensional electron gas region, wherein said at least two electron gas regions are configured in a substantially cross shape, and wherein the reconfigurable device is configured as a magnetic field sensor;
(ii) said first and second insulating layers include a polar insulating layer and a non-polar insulating layer, wherein the nanoscale quasi one- or zero-dimensional electron gas has a gap formed therein, and wherein the reconfigurable device is configured as a reconfigurable photodetector; and
(iii) the electron gas region comprises at least one memory cell, and wherein the reconfigurable device is configured as a memory device.

2. The reconfigurable device of claim 1, further comprising at least one other nanoscale quasi one- or zero-dimensional electron gas region, wherein said at least two electron gas regions are configured in a substantially cross shape, and wherein the reconfigurable device is configured as a magnetic field sensor.

3. The reconfigurable device of claim 1, wherein said first and second insulating layers include a polar insulating layer and a non-polar insulating layer, wherein the nanoscale quasi one- or zero-dimensional electron gas has a gap formed therein, and wherein the reconfigurable device is configured as a reconfigurable photodetector.

4. The reconfigurable device of claim 3, further comprising a gate electrode disposed adjacent the gap.

5. The reconfigurable device of claim 3, further comprising a plurality of quasi one-dimensional electron gas regions forming a plurality of nanowires each having a gap thereon, wherein the reconfigurable device is configured as a photodetector array.

6. The reconfigurable device of claim 1, wherein said interface extends a few unit cells into one of the first or second insulating layers.

7. The reconfigurable device of claim 6, wherein said interface extends about 3 unit cells into one of the first or second insulating layers.

8. The reconfigurable device of claim 1, wherein the electron gas region comprises at least one memory cell, and wherein the reconfigurable device is configured as a memory device.

9. A method comprising:
forming a nanoscale quasi one- or zero-dimensional electron gas region disposed at an interface between a first and a second insulating layers; and
applying an external electrical field to the electron gas region to a conductivity of the electron gas region;
wherein the electron gas region is disposed within a reconfigurable device having a structure with characteristics selected from the group consisting of the following:
(i) said device further comprises at least one other nanoscale quasi one- or zero-dimensional electron gas region, wherein said at least two electron gas regions are configured in a substantially cross shape, and wherein the reconfigurable device is configured as a magnetic field sensor;
(ii) said first and second insulating layers include a polar insulating layer and a non-polar insulating layer, wherein the nanoscale quasi one- or zero-dimensional electron gas has a gap formed therein, and wherein said device is configured as a reconfigurable photodetector; and
(iii) the electron gas region comprises at least one memory cell, and wherein the reconfigurable device is configured as a memory device.

10. The method of claim 9, wherein the first and a second insulating layers include a polar insulating layer and a non-polar insulating layer.

11. The method of claim 10, further comprising:
forming a substantially T-shaped electron gas region at an interface between the polar insulating layer and the non-polar insulating layer;
erasing a center portion of the T-shaped electron gas region with an external electric field thereby forming a source terminal, a drain terminal, and a gate terminal;
forming a nanoscale wire between the source and drain contacts wherein the nanoscale wire is substantially narrower than the T-shaped electron gas region; and
forming a gap between the source and drain terminals to thereby form a reconfigurable transistor, comprising.

12. The method of claim 11, wherein said forming a substantially T-shaped electron gas region comprises applying an external electric field to the interface at a first voltage, wherein said forming a nanoscale wire comprises applying an external electric field to the interface at a second voltage, wherein said forming a gap comprises applying an external electric field to the interface at a second voltage, wherein the first and second voltages are positive, wherein the third voltage is negative, and wherein the second and third voltages have values substantially smaller than that of the first voltage.

13. The method of claim 11, wherein said applying an external electric field comprises applying an electric field from an atomic force microscope (AFM).

* * * * *